(12) United States Patent
Shibayama et al.

(10) Patent No.: US 10,372,040 B2
(45) Date of Patent: Aug. 6, 2019

(54) RESIST UNDERLAYER FILM FORMING COMPOSITION FOR LITHOGRAPHY CONTAINING HYDROLYZABLE SILANE HAVING HALOGEN-CONTAINING CARBOXYLIC ACID AMIDE GROUP

(71) Applicant: NISSAN CHEMICAL INDUSTRIES, LTD., Tokyo (JP)

(72) Inventors: Wataru Shibayama, Toyama (JP); Kenji Takase, Funabashi (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/533,237

(22) PCT Filed: Dec. 4, 2015

(86) PCT No.: PCT/JP2015/084172
§ 371 (c)(1),
(2) Date: Jun. 5, 2017

(87) PCT Pub. No.: WO2016/093172
PCT Pub. Date: Jun. 16, 2016

(65) Prior Publication Data
US 2017/0322491 A1    Nov. 9, 2017

(30) Foreign Application Priority Data

Dec. 8, 2014   (JP) .................................. 2014-247809

(51) Int. Cl.
| | | |
|---|---|---|
| *G03F 7/11* | (2006.01) | |
| *C08L 83/04* | (2006.01) | |
| *G03F 7/40* | (2006.01) | |
| *C08L 83/06* | (2006.01) | |
| *C09D 183/04* | (2006.01) | |
| *G03F 7/26* | (2006.01) | |
| *C09D 165/00* | (2006.01) | |
| *C09D 183/08* | (2006.01) | |
| *G03F 7/038* | (2006.01) | |
| *G03F 7/039* | (2006.01) | |
| *G03F 7/16* | (2006.01) | |
| *G03F 7/20* | (2006.01) | |
| *G03F 7/38* | (2006.01) | |
| *H01L 21/027* | (2006.01) | |
| *H01L 21/308* | (2006.01) | |
| *H01L 21/311* | (2006.01) | |
| *G03F 7/075* | (2006.01) | |
| *C08G 16/00* | (2006.01) | |
| *C09D 161/00* | (2006.01) | |
| *C09D 183/06* | (2006.01) | |
| *C08G 77/26* | (2006.01) | |
| *C08G 73/06* | (2006.01) | |
| *C08G 77/24* | (2006.01) | |

(52) U.S. Cl.
CPC .............. *G03F 7/11* (2013.01); *C08G 16/00* (2013.01); *C08L 83/04* (2013.01); *C08L 83/06* (2013.01); *C09D 161/00* (2013.01); *C09D 165/00* (2013.01); *C09D 183/04* (2013.01); *C09D 183/06* (2013.01); *C09D 183/08* (2013.01); *G03F 7/038* (2013.01); *G03F 7/039* (2013.01); *G03F 7/0752* (2013.01); *G03F 7/168* (2013.01); *G03F 7/2004* (2013.01); *G03F 7/26* (2013.01); *G03F 7/38* (2013.01); *G03F 7/40* (2013.01); *H01L 21/0274* (2013.01); *H01L 21/3081* (2013.01); *H01L 21/3086* (2013.01); *H01L 21/31133* (2013.01); *H01L 21/31144* (2013.01); *C08G 73/0672* (2013.01); *C08G 77/24* (2013.01); *C08G 77/26* (2013.01); *C08G 2261/135* (2013.01); *C08G 2261/3142* (2013.01); *C08G 2261/3241* (2013.01); *C08G 2261/76* (2013.01); *G03F 7/162* (2013.01)

(58) Field of Classification Search
CPC . G03F 7/0752; G03F 7/11; G03F 7/38; G03F 7/40; H01L 21/0274; C08L 83/04; C08L 83/06; C09D 183/04
USPC ... 430/270.1, 271.1, 273.1, 282.1, 322, 325, 430/329, 330, 331; 438/703; 428/448
See application file for complete search history.

(56) References Cited

U.S. PATENT DOCUMENTS

| | | | | |
|---|---|---|---|---|
| 2011/0243878 A1* | 10/2011 | Panandiker | .......... | C08G 77/388 424/78.03 |
| 2012/0270057 A1* | 10/2012 | Yamane | .................. | C03C 17/30 428/429 |
| 2015/0078792 A1* | 3/2015 | Aoyagi | .............. | G03G 15/1615 399/302 |

FOREIGN PATENT DOCUMENTS

| | | |
|---|---|---|
| JP | 2007-226170 A | 9/2007 |
| JP | 2008-158002 A | 7/2008 |

(Continued)

OTHER PUBLICATIONS

Mar. 1, 2016 Written Opinion issued in International Patent Application No. PCT/JP2015/084172.

(Continued)

*Primary Examiner* — Amanda C. Walke
(74) *Attorney, Agent, or Firm* — Oliff PLC

(57) ABSTRACT

A resist underlayer film forming composition for lithography that can be used as a hard mask. The composition can improve pattern resolution due to having a trihalogenoacetamide skeleton. A resist underlayer film forming composition for lithography comprising a hydrolyzable silane, a hydrolysis product thereof, a hydrolysis condensate thereof, or a combination thereof as a silane, wherein the hydrolyzable silane comprises a silane having a halogen-containing carboxylic acid amide group.

13 Claims, No Drawings

(56) References Cited

FOREIGN PATENT DOCUMENTS

| WO | 2010/071155 A1 | 6/2010 |
| WO | 2011/033965 A1 | 3/2011 |
| WO | 2011/105368 A1 | 9/2011 |
| WO | 2013/022099 A1 | 2/2013 |
| WO | 2013/161372 A1 | 10/2013 |
| WO | 2013/191203 A1 | 12/2013 |

OTHER PUBLICATIONS

Ganesan et al. "Top Surface Imaging Study by Selective Chemisorptions of Poly(dimethyl siloxane) on Diazoketo-fucntionalized Polymeric Surface", Proc. of SIPE, vol. 6792, 2008.
Mar. 1, 2016 International Search Report issued in International Patent Application No. PCT/JP2015/084172.

* cited by examiner

RESIST UNDERLAYER FILM FORMING COMPOSITION FOR LITHOGRAPHY CONTAINING HYDROLYZABLE SILANE HAVING HALOGEN-CONTAINING CARBOXYLIC ACID AMIDE GROUP

TECHNICAL FIELD

The present invention relates to a composition for forming an underlayer film between a substrate and a resist (for example, a photoresist and an electron beam resist) used for manufacturing a semiconductor device. More specifically, the present invention relates to a resist underlayer film forming composition for lithography for forming an underlayer film used as an underlayer of a photoresist in a lithography process for producing a semiconductor device. The present invention also relates to a method of forming a resist pattern using the underlayer film forming composition.

BACKGROUND ART

Microfabrication by lithography using photoresists has been carried out in production of semiconductor devices. The microfabrication is a processing method including forming the thin film of a photoresist on a semiconductor substrate such as a silicon wafer, irradiating the formed thin film with active light such as ultraviolet rays through a mask pattern in which a semiconductor device pattern is drawn, developing the irradiated thin film, and etching the substrate using the obtained photoresist pattern as a protecting film, thereby forming fine unevenness corresponding to the pattern. In recent years, however, semiconductor devices have been further integrated, and the active light to be used has tended to have a shorter wavelength from a KrF excimer laser (248 nm) to an ArF excimer laser (193 nm). This has raised serious problems of the effects of the reflection of active light from the semiconductor substrate.

As an underlayer film between the semiconductor substrate and the photoresist, a film known as a hard mask containing metal elements such as silicon or titanium has been used. In this case, the resist and the hard mask have a large difference in their constituent components and thus the rate of removal by dry etching significantly depends on the kind of gas used for the dry etching. The hard mask can be removed by the dry etching without significant reduction in the film thickness of the photoresist by appropriately selecting the kind of gas. As described above, in order to achieve various effects such as antireflection effect, a resist underlayer film has been disposed between the semiconductor substrate and the photoresist in the production of semiconductor devices in recent years. Studies on the composition for the resist underlayer film have been carried out up to now and development of new materials for the resist underlayer film is desired from the viewpoint of diversity of required properties and the like.

For example, a resist underlayer film containing a polysiloxane using a silane having a sulfone structure has been developed (refer to Patent Document 1).

A resist underlayer film containing a polysiloxane using a silane having a sulfonamide structure has also been developed (refer to Patent Document 2).

A resist underlayer film containing a polysiloxane using a silane having a sulfone structure and an amine structure has also been developed (refer to Patent Document 3).

PRIOR ART DOCUMENTS

Patent Documents

Patent Document 1: WO 2013-022099 Pamphlet
Patent Document 2: WO 2011-033965 Pamphlet
Patent Document 3: WO 2013-191203 Pamphlet

SUMMARY OF THE INVENTION

Problem to be Solved by the Invention

An object of the present invention is to provide a resist underlayer film forming composition for lithography that can be used for producing a semiconductor device. Specifically, an object of the present invention is to provide a resist underlayer film forming composition for lithography for forming a resist underlayer film that can be used as a hard mask. Another object of the present invention is to provide a resist underlayer film forming composition for lithography for forming a resist underlayer film that can be used as an anti-reflective coating. Another object of the present invention is to provide a resist underlayer film for lithography that does not cause intermixing with a resist and has a high dry etching rate compared with the etching rate of the resist and a resist underlayer film forming composition for forming the underlayer film.

Another object of the present invention is to provide a resist underlayer film forming composition for forming a resist underlayer film that can form an excellent resist pattern shape when an upper layer resist is exposed and developed with an alkali developer or an organic solvent and can transfer a rectangular resist pattern to the underlayer by dry etching carried out later.

Means for Solving the Problem

The present invention includes, as a first aspect, a resist underlayer film forming composition for lithography comprising: a hydrolyzable silane, a hydrolysis product thereof, a hydrolysis condensate thereof, or a combination thereof as a silane, in which the hydrolyzable silane comprises a hydrolyzable silane having a halogen-containing carboxylic acid amide group, As a second aspect, the resist underlayer film forming composition according to the first aspect, in which the hydrolyzable silane having a halogen-containing carboxylic acid amide group is a hydrolyzable silane of Formula (1):

$$R^1_a R^2_b Si(R^3)_{4-(a+b)} \quad \text{Formula (1)}$$

(in Formula (1), $R^1$ is an organic group of Formula (2):

Formula (2)

(in Formula (2), $R^4$ is an organic group optionally having an amide group, an amino group, an ether group, or a sulfonyl group and the organic group is a $C_{1-10}$ alkylene group, an arylene group, or a combination thereof; $R^5$ is a hydrogen atom or a $C_{1-10}$ alkyl group; $R^6$ is an organic group substituted with a halogen atom or an organic group having a halogen ion and the organic group is a $C_{1-10}$ alkyl group, a $C_{3-20}$ cyclic alkyl group, a $C_{1-10}$ alkylene group, a $C_{6-40}$ aryl group, a $C_{6-40}$ arylene group, a heterocyclic group, or a combination thereof optionally having a sulfonyl group, a thiol group, an ether group, or a carbonyl group) and is bonded to a silicon atom through a Si—C bond; $R^2$ is an organic group having an alkyl group, an aryl group, a halogenated alkyl group, a halogenated aryl group, an alkoxyaryl group, an alkenyl group, or an epoxy group, an acryloyl group, a methacryloyl group, a mercapto group, an amino group, or a cyano group and is bonded to a silicon atom through a Si—C bond; $R^3$ is an alkoxy group, an acyloxy group, or a halogen group; a is an integer of 1, b is an integer of 0 to 2, and a+b is an integer of 1 to 3), as a third aspect, the resist underlayer film forming composition according to the first aspect or the second aspect, in which a halogen atom in the halogen-containing carboxylic acid amide group is a fluorine atom, as a fourth aspect, the resist underlayer film forming composition according to the first aspect or the second aspect, in which the halogen-containing carboxylic acid amide group is a trifluoroacetamide group, as a fifth aspect, the resist underlayer film forming composition according to any one of the first aspect to the fourth aspect, in which the hydrolyzable silane is a combination of the hydrolyzable silane of Formula (1) and other hydrolyzable silane, and the other hydrolyzable silane is at least one hydrolyzable silane selected from the group consisting of a hydrolyzable silane of Formula (3):

$$R^7_c Si(R^8)_{4-c} \quad \text{Formula (3)}$$

(in Formula (3), $R^7$ is an organic group having an alkyl group, an aryl group, a halogenated alkyl group, a halogenated aryl group, an alkoxyaryl group, an alkenyl group, or an epoxy group, an acryloyl group, a methacryloyl group, a mercapto group, or a cyano group and is bonded to a silicon atom through a Si—C bond; $R^8$ is an alkoxy group, an acyloxy group, or a halogen group; and c is an integer of 0 to 3) and a hydrolyzable silane of Formula (4):

$$[R^9_d Si(R^{10})_{3-d}]_2 Y_e \quad \text{Formula (4)}$$

(in Formula (4), $R^9$ is an alkyl group and is bonded to a silicon atom through a Si—C bond; $R^{10}$ is an alkoxy group, an acyloxy group, or a halogen group; Y is an alkylene group or an arylene group; d is an integer of 0 or 1; and e is an integer of 0 or 1), as a sixth aspect, the resist underlayer film forming composition according to the first aspect, in which the resist underlayer film forming composition comprises a hydrolysis condensate of a hydrolyzable silane made of a combination of the hydrolyzable silane of Formula (1) according to the second aspect and the hydrolyzable silane of Formula (3) according to the fifth aspect as a polymer, as a seventh aspect, the resist underlayer film forming composition according to any one of the first aspect to the sixth aspect, further comprising an acid, as an eighth aspect, the resist underlayer film forming composition according to any one of the first aspect to the seventh aspect, further comprising water, as a ninth aspect, a resist underlayer film formed on a semiconductor substrate and made of a cured product of the resist underlayer film forming composition according to any one of the first aspect to the eighth aspect, as a tenth aspect, a method for manufacturing a semiconductor device comprising: applying the resist underlayer film forming composition according to any one of the first aspect to the eighth aspect onto a semiconductor substrate and baking the applied composition to form a resist underlayer film; applying a resist composition onto the resist underlayer film to form a resist film; exposing the resist film to light; developing the resist film after exposure to obtain a resist pattern; etching the resist underlayer film using the resist pattern; and processing the semiconductor substrate using the patterned resist film and resist underlayer film, and as an eleventh aspect, a method for manufacturing a semiconductor device comprising: forming an organic underlayer film on a semiconductor substrate; applying a resist underlayer film forming composition according to any one of the first aspect to the eighth aspect onto the organic underlayer film and baking the applied composition to form a resist underlayer film; applying a resist composition onto the resist underlayer film to form a resist film; exposing the resist film to light; developing the resist film after exposure to obtain a resist pattern; etching the resist underlayer film using the resist pattern; etching the organic underlayer film using the patterned resist underlayer film; and processing the semiconductor substrate using the patterned organic underlayer film.

Effects of the Invention

The resist underlayer film formed from the resist underlayer film forming composition for lithography of the present invention functions as a hard mask and can be used as an anti-reflective coating. The composition of the present invention does not cause intermixing with the resist.

The resist film tends to become thin in order to prevent pattern collapse when a fine pattern is formed. The dry etching for transferring the pattern to the film existing at the underlayer is required to have a higher etching rate than that of the upper layer film due to thinning of the resist. To this requirement, the resist underlayer film forming composition of the present invention can provide a resist underlayer film for lithography having a higher dry etching rate than that of a resist.

In order to control the resist shape in any development process of any generation of lithography, the acidity of the underlayer film is required to be adjusted. In particular, the skeleton generating acid with light of each wavelength such as KrF, ArF, and EUV, and EB can enhance the contrast of the photoresist and is considered to be useful.

The resist underlayer film forming composition of the present invention includes a hydrolyzable silane having a halogen-containing carboxylic acid amide group, in particular a trifluoroacetamide group. Accordingly, the composition of the present invention can improve pattern resolution particularly in ArF exposure and EUV exposure due to having a trifluoroacetamide skeleton that can generate an acid by exposure.

MODES FOR CARRYING OUT THE INVENTION

The present invention includes a resist underlayer film forming composition for lithography comprising: a hydrolyzable silane, a hydrolysis product thereof, a hydrolysis condensate thereof, or a combination thereof as a silane, in which the hydrolyzable silane comprises a hydrolyzable silane having a halogen-containing carboxylic acid amide group.

More specifically, the resist underlayer film forming composition of the present invention comprises a hydrolyzable silane of Formula (1) or the hydrolyzable silane of Formula (1) and other hydrolyzable silane (for example, a hydrolyzable silane of Formula (3)), a hydrolysis product thereof, or a hydrolysis condensate thereof and a solvent. As optional components, an acid, water, an alcohol, a curing catalyst, an acid generator, another organic polymer, a light absorbing compound, a surfactant, and the like can be contained.

In the total silane, the hydrolyzable silane of Formula (1) can be used, for example, in a range of 50 mol % or less, or 0.05 mol % to 50 mol %, 0.1 mol % to 30 mol %, or 0.1 mol % to 10 mol %.

The solid content in the resist underlayer film forming composition of the present invention is, for example, 0.1% by mass to 50% by mass, 0.1% by mass to 30% by mass, or 0.1% by mass to 25% by mass. Here, the solid content is the content of the remaining components formed by removing the solvent components from the whole components of the resist underlayer film forming composition.

The ratio of the hydrolyzable silane, the hydrolysis product thereof, and the hydrolysis condensate thereof contained in the solid content is 20% by mass or more, and for example, 50% by mass to 100% by mass, 60% by mass to 99% by mass, or 70% by mass to 99% by mass.

The hydrolyzable silane, the hydrolysis product thereof, and the hydrolysis condensate thereof can be used as a mixture thereof. A compound formed by condensing a hydrolysis product obtained by hydrolyzing the hydrolyzable silane can be used as the condensate. A mixture can also be used in which the hydrolysis condensate is mixed with a partial hydrolysis product or a silane compound in which hydrolysis is not fully completed at the time of obtaining the hydrolysis condensate. The condensate is a polymer having a polysiloxane structure. This polysiloxane includes a hydrolysis condensate made of the hydrolyzable silane of Formula (1) or a combination of the hydrolyzable silane of Formula (1) and other hydrolyzable silane (for example, a hydrolyzable silane of Formula (3)). In addition, the hydrolyzable silane of Formula (1) or a hydrolyzable silane made of a combination of the hydrolyzable silane of Formula (1) and the hydrolyzable silane of Formula (3) can be added to the hydrolysis condensate (a polysiloxane) of the hydrolysis product made of the hydrolyzable silane of Formula (1) or the hydrolyzable silane made of a combination of the hydrolyzable silane of Formula (1) and the hydrolyzable silane of Formula (3).

In Formula (1), $R^1$ is an organic group of Formula (2) and is bonded to the silicon atom through a Si—C bond. $R^2$ is an organic group having an alkyl group, an aryl group, a halogenated alkyl group, a halogenated aryl group, an alkoxyaryl group, an alkenyl group, or an epoxy group, an acryloyl group, a methacryloyl group, a mercapto group, an amino group, or a cyano group and is bonded to a silicon atom through a Si—C bond. $R^3$ is an alkoxy group, an acyloxy group, or a halogen group. a is an integer of 1, b is an integer of 0 to 2, and a+b is an integer of 1 to 3.

In Formula (2), $R^4$ is an organic group optionally having an amide group, an amino group, an ether group, or a sulfonyl group and the organic group is a $C_{1-10}$ alkylene group, an arylene group, or a combination thereof. $R^5$ is a hydrogen atom or a $C_{1-10}$ alkyl group. $R^6$ is an organic group substituted with a halogen atom or an organic group having a halogen ion and the organic group is a $C_{1-10}$ alkyl group, a $C_{1-10}$ alkylene group, a $C_{6-40}$ aryl group, a $C_{6-40}$ arylene group, a heterocyclic group, or a combination thereof optionally having a sulfonyl group, a thiol group, an ether group, or a carbonyl group.

The alkyl group includes a linear or branched $C_{1-10}$ alkyl group and examples of the alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,22-trimethyl-n-propyl group, 1-ethyl-1-methyl-n-propyl group, and 1-ethyl-2-methyl-n-propyl group.

The cyclic alkyl group can also be used and examples of $C_{3-20}$ cyclic alkyl groups include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, 2-ethyl-3-methyl-cyclopropyl group, adamantane group, norbornene group, and norbornane group.

Examples of the alkylene group include an alkylene group derived from the above alkyl group. For example, methylene group, ethylene group, and propylene group are derived from methyl group, ethyl group, and propyl group, respectively.

The alkenyl group includes a $C_{2-10}$ alkenyl group and examples of the alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and a 3-cyclohexenyl group.

The aryl group includes a $C_{6-40}$ aryl group and examples of the aryl group include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

Examples of the arylene group include an arylene group derived from the above aryl group. For example, phenylene group and naphthylene group are derived from phenyl group and naphthyl group, respectively.

Examples of the organic group having an epoxy group include glycidoxymethyl group, glycidoxyethyl group, glycidoxypropyl group, glycidoxybutyl group, and epoxycyclohexyl group.

Examples of the organic group having an acryloyl group include acryloylmethyl group, acryloylethyl group, and acryloylpropyl group.

Examples of the organic group having a methacryloyl group include methacryloylmethyl group, methacryloylethyl group, and methacryloylpropyl group.

Examples of the organic group having a mercapto group include ethylmercapto group, butylmercapto group, hexylmercapto group, and octylmercapto group.

Examples of the organic group having an amino group include amino group, aminomethyl group, and aminoethyl group.

Examples of the organic group having a cyano group include cyanoethyl group and cyanopropyl group.

The alkoxy group includes an alkoxy group having a linear, branched, or cyclic alkyl moiety having a carbon atom number of 1 to 20. Examples of the alkoxy group having the linear and branched alkyl moiety include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group. Examples of the alkoxy group having the cyclic alkyl moiety include cyclopropoxy group, cyclobutoxy group, 1-methyl-cyclopropoxy group, 2-methyl-cycopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group. The alkoxyaryl group is an aryl group substituted with an alkoxy group and examples of the alkoxyaryl group include methoxyphenyl group and ethoxyphenyl group.

The acyloxy group includes the $C_{2-20}$ acyloxy group and examples of the acyloxy group include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1,1,2-trimethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

The halogenated alkyl group and the halogenated aryl group are, for example, the above alkyl group and aryl group substituted with a halogen group. Examples of the halogen group include fluorine, chlorine, bromine, and iodine.

As described above, Formula (2) is a functional group having a carboxylic acid amide structure.

In Formula (2), $R^6$ is an organic group substituted with a halogen atom or an organic group having a halogen ion. Examples of the halogen include fluorine, chlorine, bromine, and iodine.

Examples of the organic group substituted with a halogen atom include an organic group of a $C_{1-10}$ alkyl group, a $C_{1-10}$ alkylene group, a $C_{6-40}$ aryl group, a $C_{6-40}$ arylene group, and a heterocyclic group in which some of or all of the hydrogen atoms are substituted with halogen atoms.

As an organic group having a halogen ion, a part of a heterocyclic structure forms a salt and the halogen ion can be contained as an anion component Examples of the alkyl group substituted with halogen atoms include perfluoromethyl group (that is, trifluoromethyl group), perfluoroethyl group, perfluoropropyl group, and perfluorobutyl group.

The hydrolyzable silane of Formula (1) can be exemplified as follows.

T in each of the following formulas is a $C_{1-10}$ alkyl group, for example, methyl group or ethyl group can be preferably used. In the case where T is methyl group, the hydrolyzable group is methoxy group and in the case where T is ethyl group, the hydrolyzable group is ethoxy group.

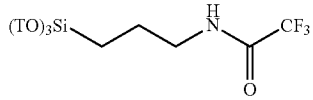

Formula (1-1)

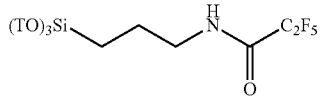

Formula (1-2)

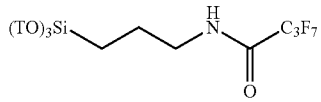

Formula (1-3)

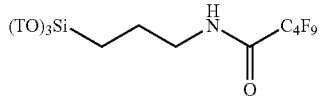

Formula (1-4)

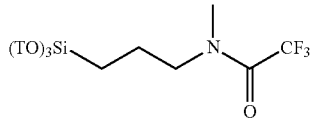

Formula (1-5)

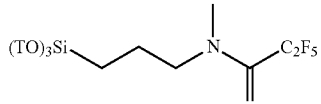

Formula (1-6)

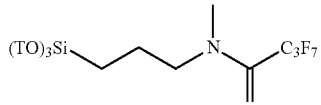

Formula (1-7)

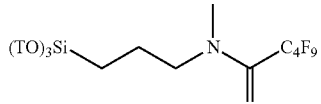

Formula (1-8)

-continued

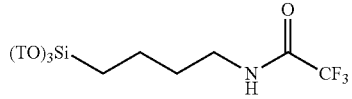

Formula (1-9)

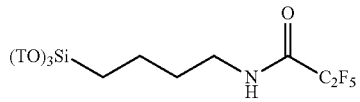

Formula (1-10)

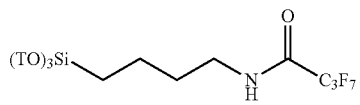

Formula (1-11)

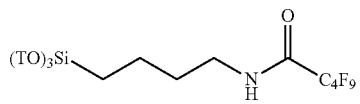

Formula (1-12)

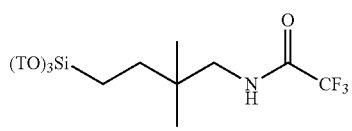

Formula (1-13)

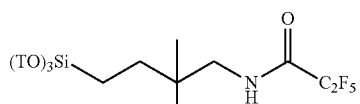

Formula (1-14)

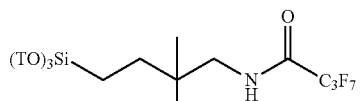

Formula (1-15)

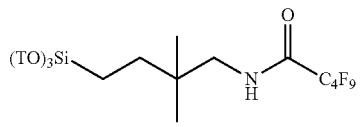

Formula (1-16)

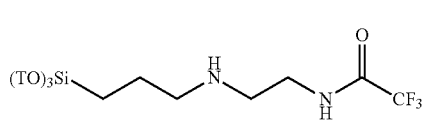

Formula (1-17)

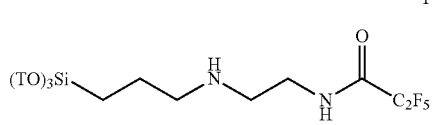

Formula (1-18)

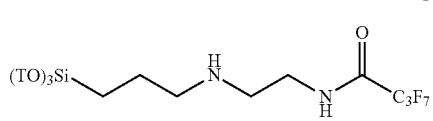

Formula (1-19)

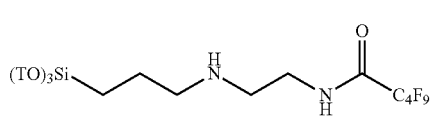

Formula (1-20)

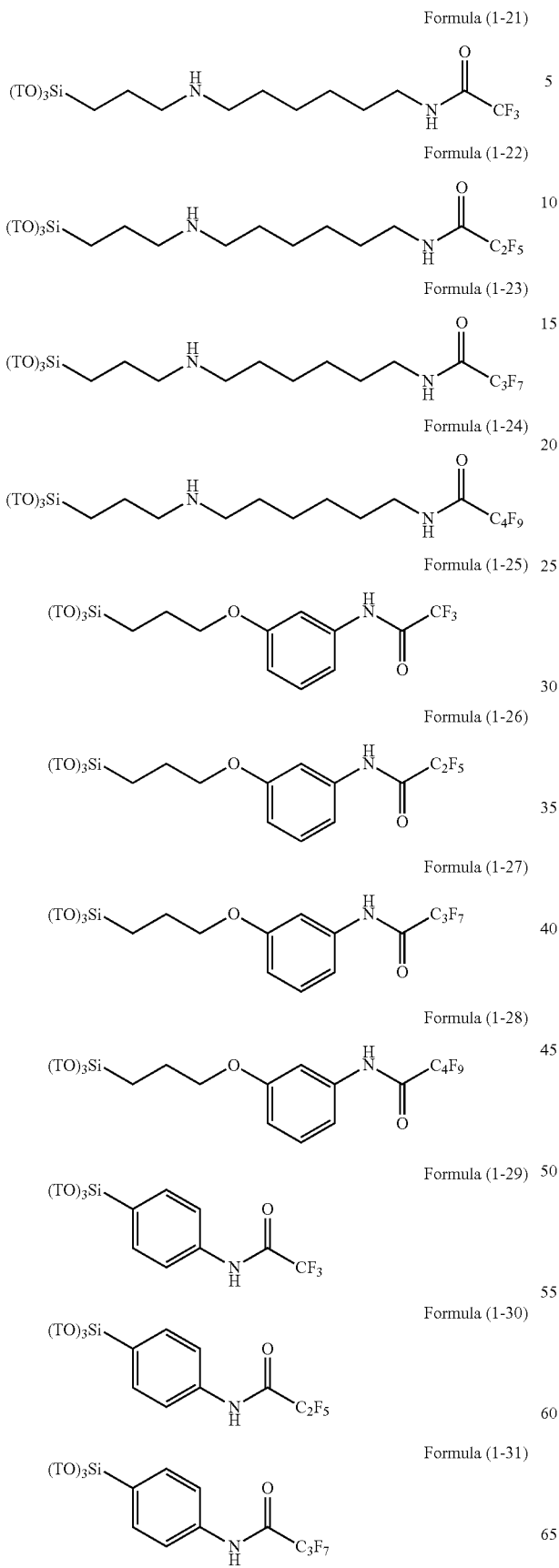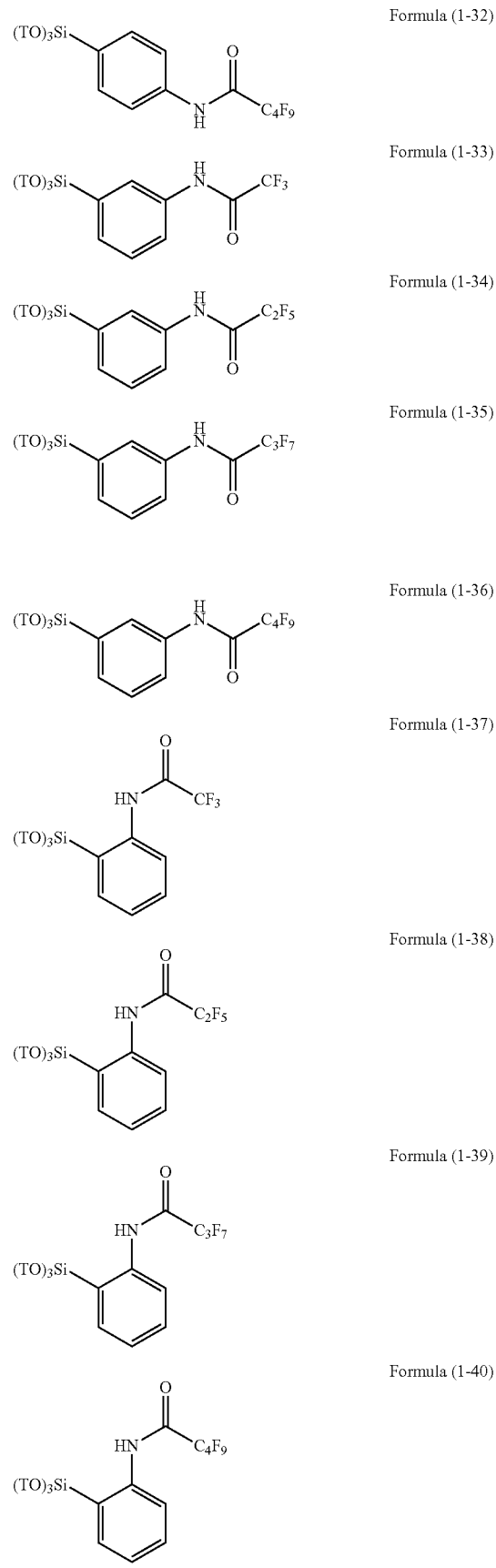

Formula (1-41)
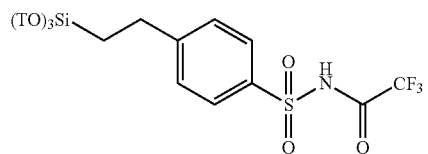
Formula (1-42)
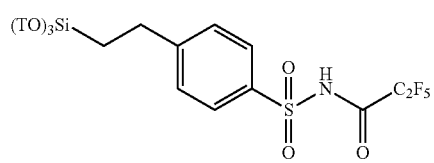
Formula (1-43)
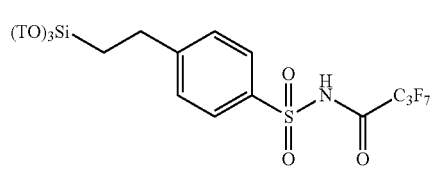
Formula (1-44)
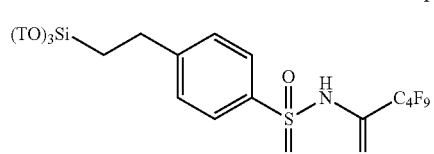
Formula (1-45)
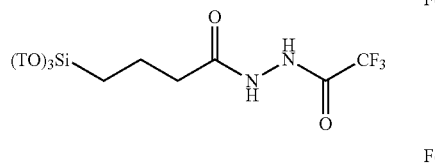
Formula (1-46)
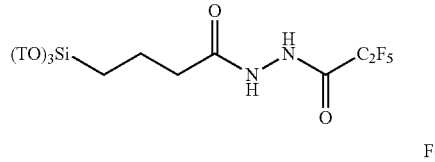
Formula (1-47)
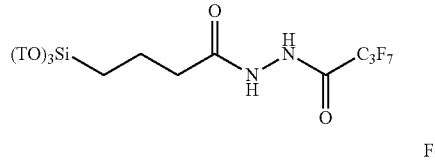
Formula (1-48)
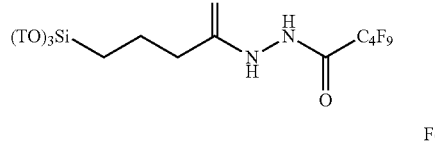
Formula (1-49)
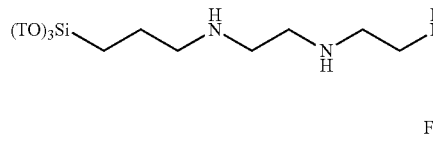
Formula (1-50)
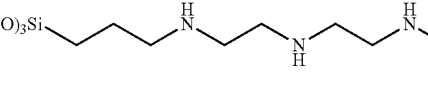
Formula (1-51)
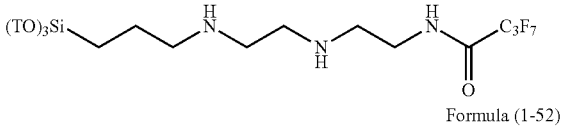
Formula (1-52)
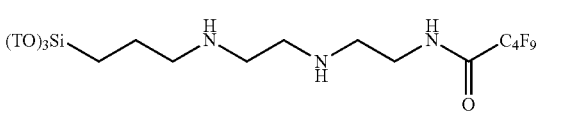
Formula (1-53)
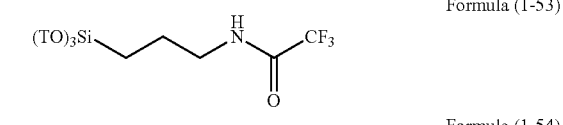
Formula (1-54)
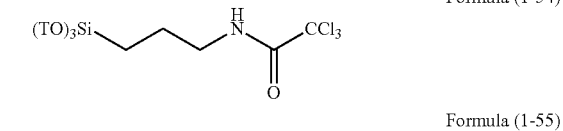
Formula (1-55)
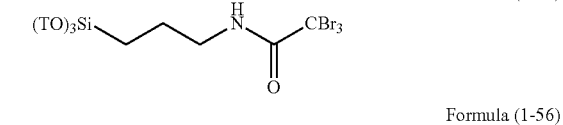
Formula (1-56)
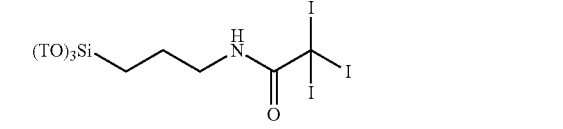
Formula (1-57)
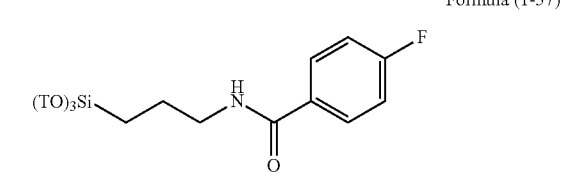
Formula (1-58)
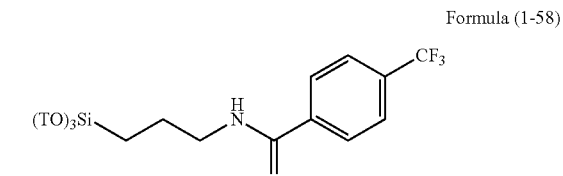
Formula (1-59)
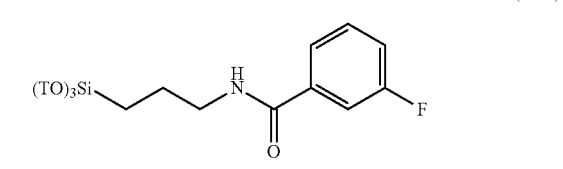
Formula (1-60)
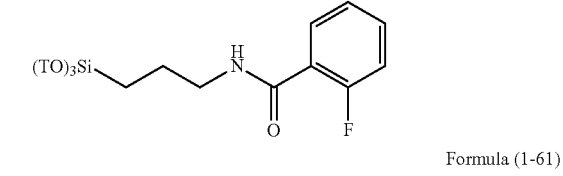
Formula (1-61)
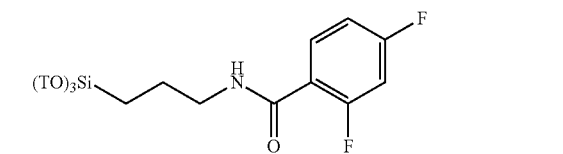

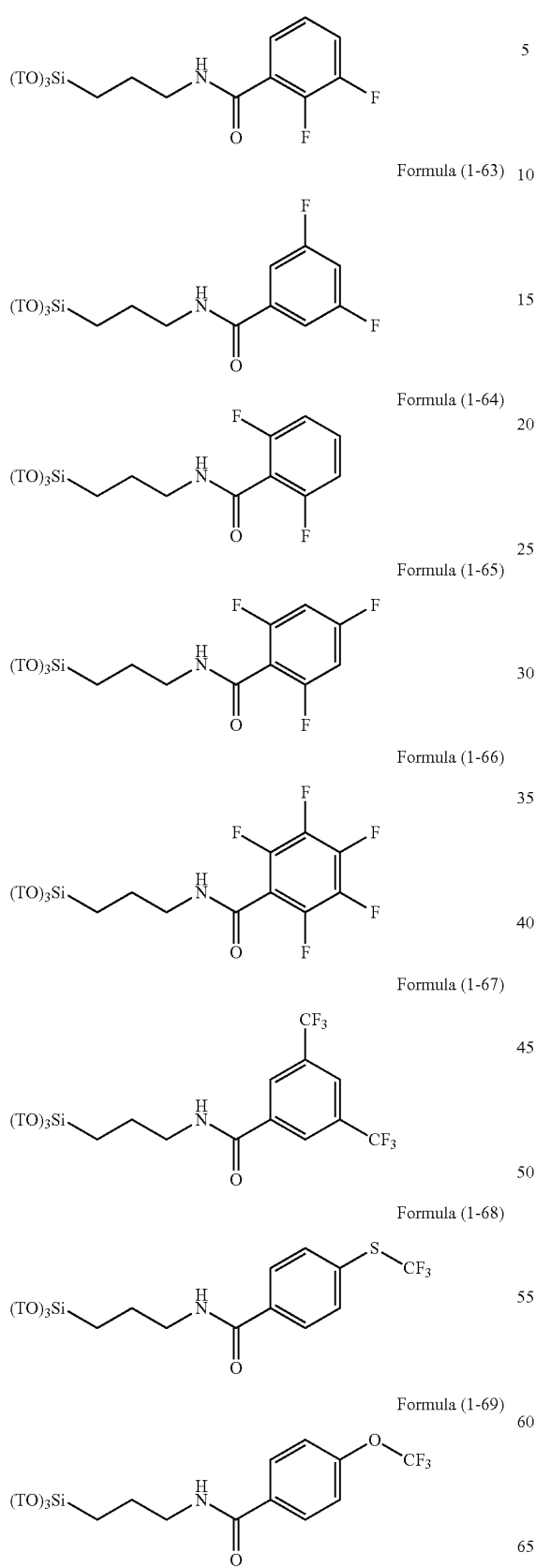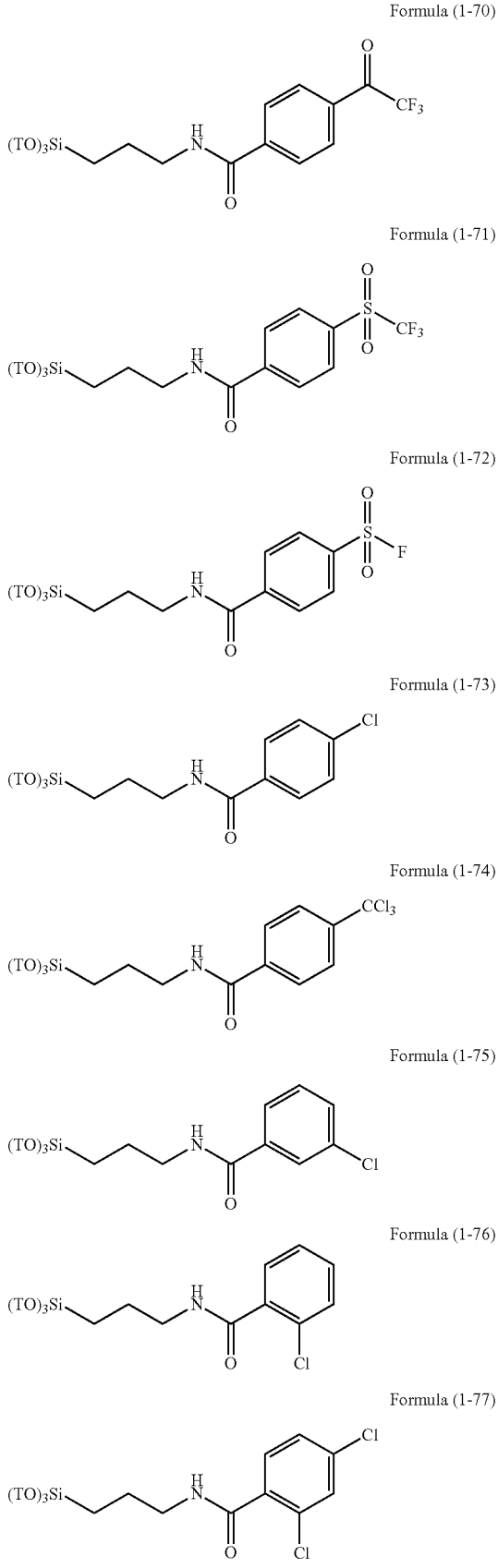

Formula (1-78)
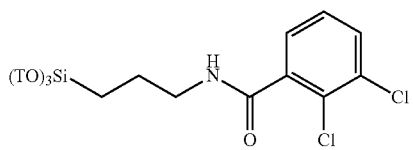

Formula (1-79)
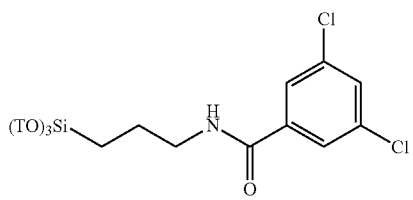

Formula (1-80)
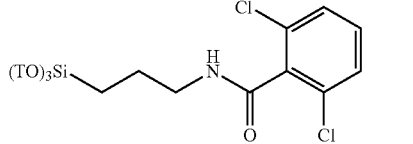

Formula (1-81)
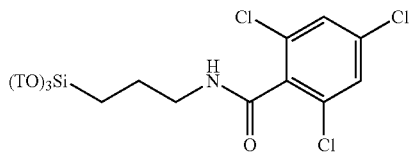

Formula (1-82)
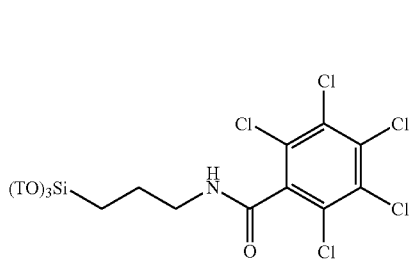

Formula (1-83)
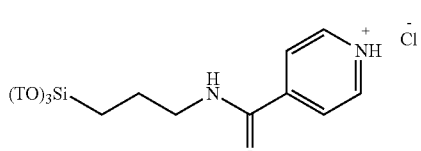

Formula (1-84)
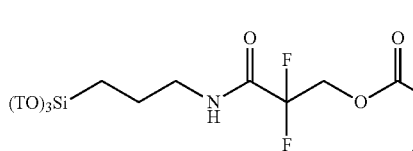

Formula (1-85)
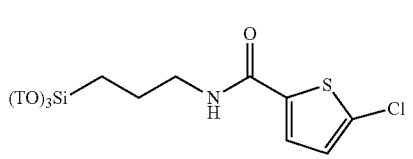

Formula (1-86)
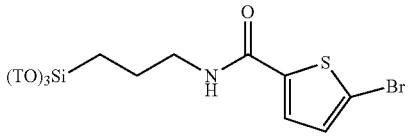

Formula (1-87)
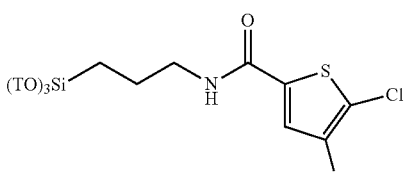

Formula (1-88)
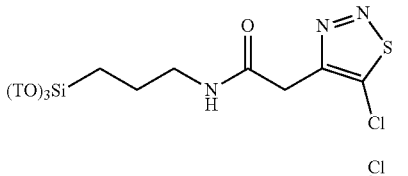

Formula (1-89)
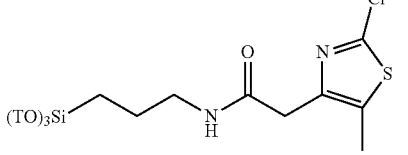

As the halogen atom of the halogen-containing carboxylic acid amide group used in the present invention, a fluorine atom can be preferably used. As the halogen-containing carboxylic acid amide group, a trifluoroacetamide group can be used.

In the present invention, the hydrolyzable silane includes a combination of the hydrolyzable silane of Formula (1) and other hydrolyzable silane. As the other hydrolyzable silane, at least one hydrolyzable silane selected from the group consisting of the hydrolyzable silane of Formula (3) and the hydrolyzable silane of Formula (4) can be used.

In Formula (3), $R^7$ is an organic group having an alkyl group, an aryl group, a halogenated alkyl group, a halogenated aryl group, an alkoxyaryl group, an alkenyl group, or an epoxy group, an acryloyl group, a methacryloyl group, a mercapto group, or a cyano group and is bonded to a silicon atom through a Si—C bond. $R^8$ is an alkoxy group, an acyloxy group, or a halogen group. c is an integer of 0 to 3.

In Formula (4), $R^9$ is an alkyl group and is bonded to a silicon atom through a Si—C bond. $R^{10}$ is an alkoxy group, an acyloxy group, or a halogen group. Y is an alkylene group or an arylene group. d is an integer of 0 or 1 and e is an integer of 0 or 1.

The above examples can be used as the organic group having the alkyl group, the aryl group, the halogenated alkyl group, the halogenated aryl group, the alkoxyaryl group, the alkenyl group, or the epoxy group, the acryloyl group, the methacryloyl group, the mercapto group, or the cyano group, and the alkoxy group, the acyloxy group, and the halogen group.

Examples of the silicon-containing compound of Formula (3) include tetramethoxysilane, tetrachlorosilane, tetraacetoxysilane, tetraethoxysilane, tetra-n-propoxysilane, tetraisopropoxysilane, tetra-n-butoxysilane, methyltrimethoxysilane, methyltrichlorosilane, methyltriacetoxysilane, methyltripropoxy silane, methyltributyloxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimetboxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyehynethyldimethoxysilane, α-glycidoxyethylmethyldiethoxysilane, β-glycidoxyethylmethyl dimethoxysilane, β-gycidoxyethylethyl dimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilanc, γ-glycidoxypropylvinyldimethoxysilane, γ-glycidoxypropylvinyldiethoxysilane, ethyltrimethoxysilane, ethyltriethoxysilane, vinyltrimnethoxysilane, vinyltrichiorosilane, vinyltriacetoxysilane, vmnyltriethoxysilane, methoxyphenyltrimethoxysilane, mcthoxyphenyltriethoxysilane, methoxyphenyltriacetoxysilane, methoxyphenyltrichiorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenetbyltriacetoxysilane, methoxyphenethyltrichlorosilane, ethoxyphenyltrimethoxysilane, etboxyphenyltriethoxysilane, ethoxyphenyltriacetoxysilane, ethoxyphenyltrichlorosilane, ethoxybenzyltrimethoxysilane, etboxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimetboxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybcnzyltriethoxysilane, t-butoxybenzyltriacetoxysilane, t-buoxybenzyltrichlorosilane, methoxynaphthyltrimetboxysilanc, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphtbyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimetboxysilane, γ-chloropropylmethyldiethoxysilane, dimethyldiacetoxysilane, γ-methacryloxypropylmethyldimnethoxysilane, γ-methacryloxypropylmnethyldiethoxysilane, γ-mercaptopropylmethyldimnethoxysilane, γ-mercaptomnethyldiethoxysilane, methylvinyldimethoxysilane, and methylvinyldiethoxysilane.

The following hydrolyzable silanes can also be used.

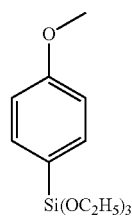

Formula (A-1)

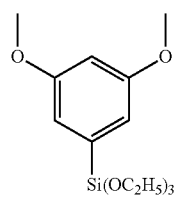

Formula (A-2)

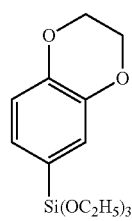

Formula (A-3)

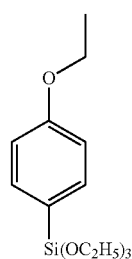

Formula (A-4)

-continued
Formula (A-5)
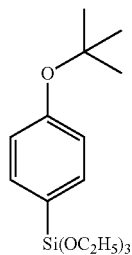
Formula (A-10)
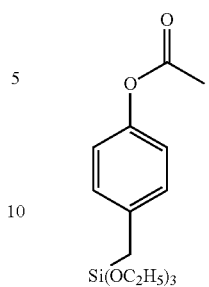
Formula (A-6)
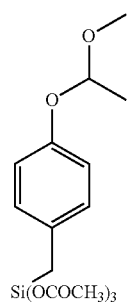
Formula (A-11)
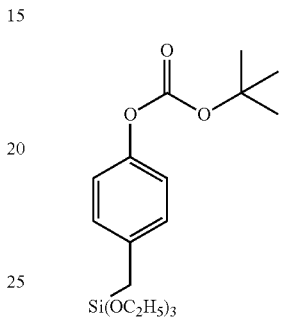
Formula (A-7)
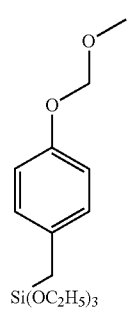
Formula (A-12)
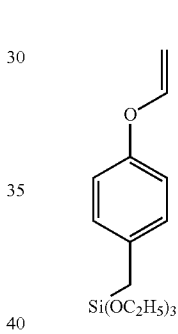
Formula (A-8)
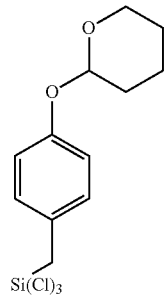
Formula (A-13)
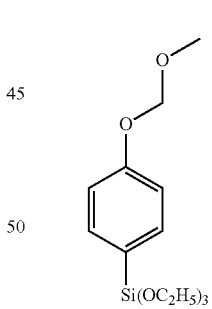
Formula (A-9)
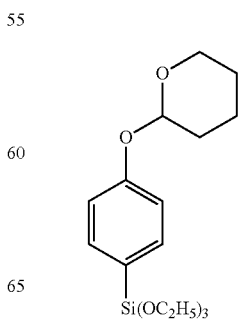
Formula (A-14)

Formula (A-15)
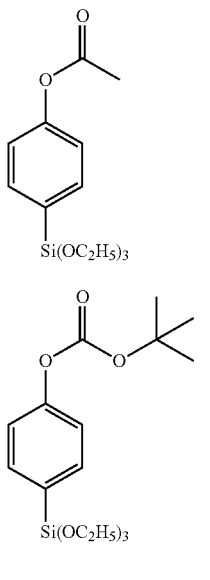
Formula (A-21)
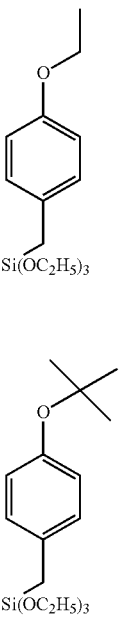
Formula (A-16)
Formula (A-22)
Formula (A-17)
Formula (A-23)
Formula (A-18)
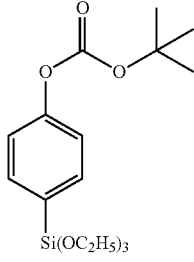
Formula (A-24)
Formula (A-19)
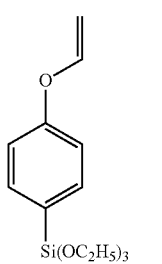
Formula (A-25)
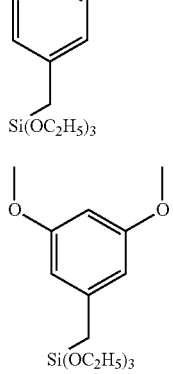

Formula (A-26)
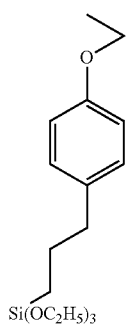
Formula (A-30)
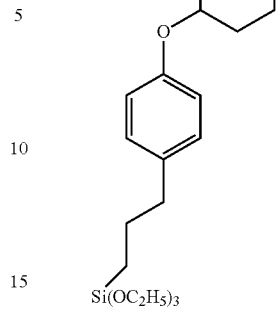
Formula (A-27)
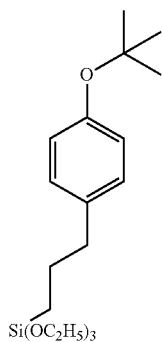
Formula (A-31)
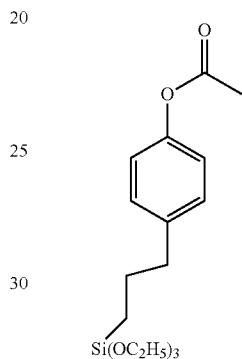
Formula (A-28)
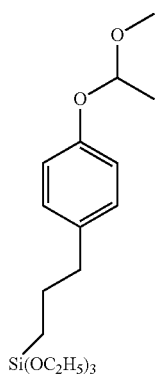
Formula (A-32)
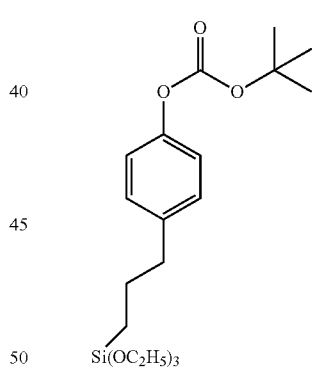
Formula (A-29)
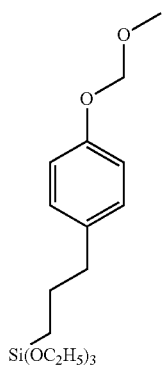
Formula (A-33)
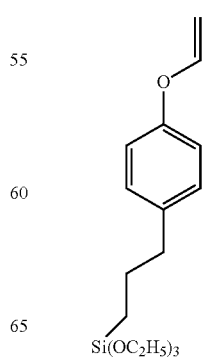

Formula (A-34)
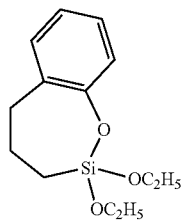
Formula (A-35)
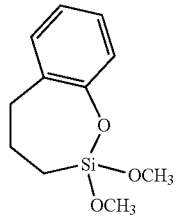
Formula (A-36)
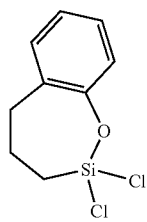
Formula (A-37)
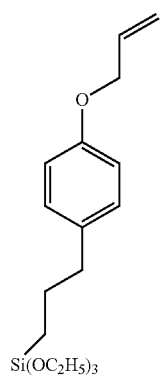
Formula (A-38)
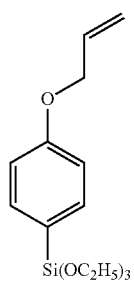
Formula (A-39)
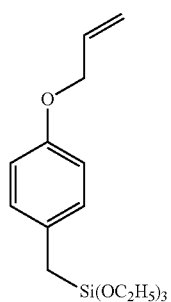
Formula (A-40)
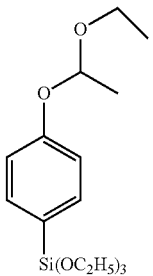
Formula (A-41)
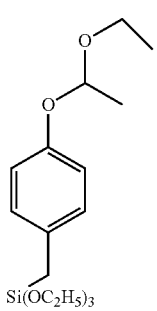
Formula (A-42)
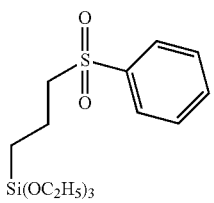
Formula (A-43)
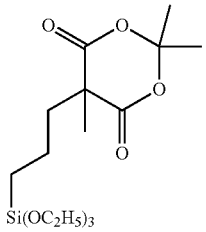
Formula (A-44)
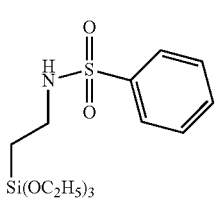
Formula (A-45)
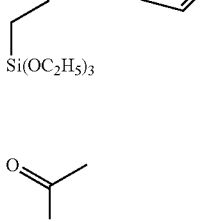

Formula (A-46)

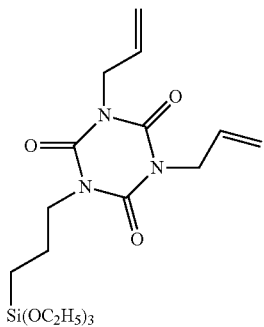

Examples of the silicon-containing compound of Formula (4) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Specific examples of the hydrolysis condensate (polysiloxane) used in the present invention are exemplified below.

Formula (2-1)

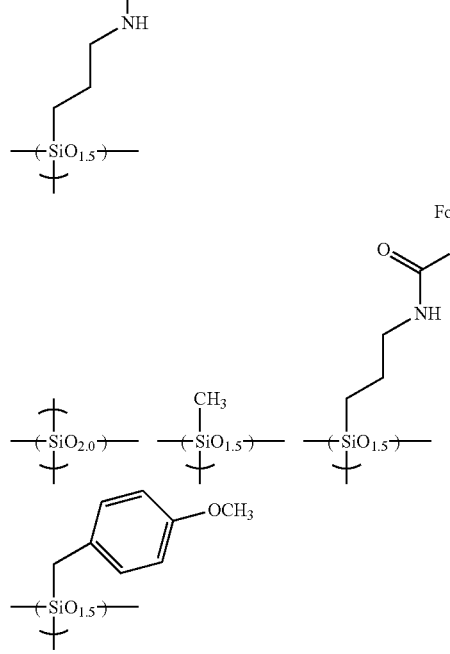

Formula (2-2)

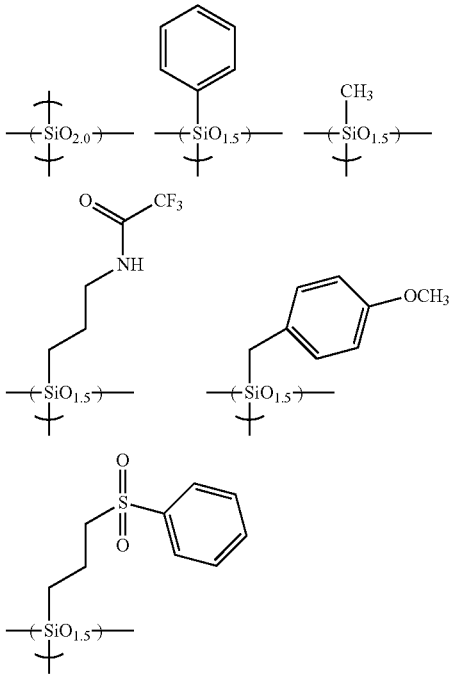

Formula (2-3)

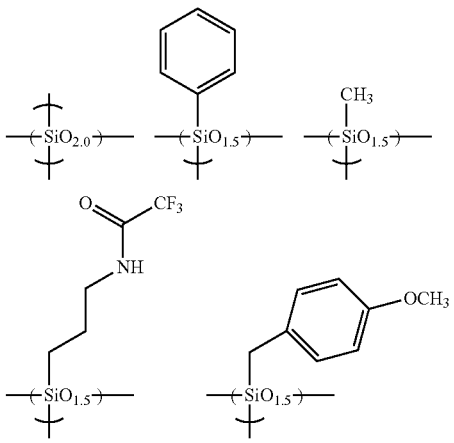

Formula (2-4)

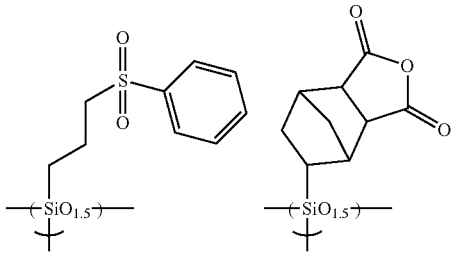

Formula (2-5)

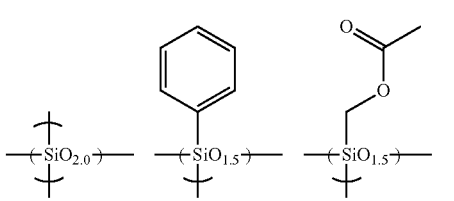

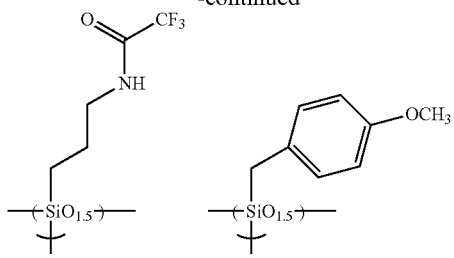
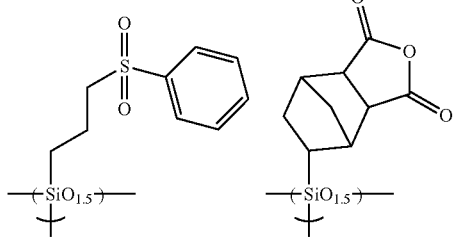
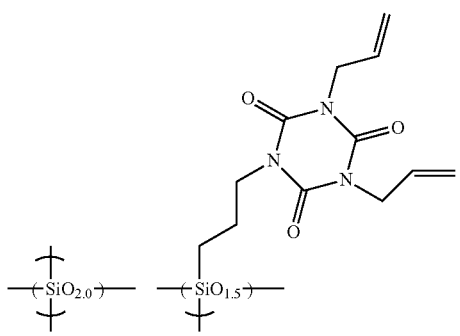

Formula (2-6)

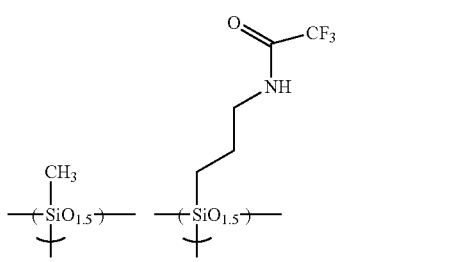

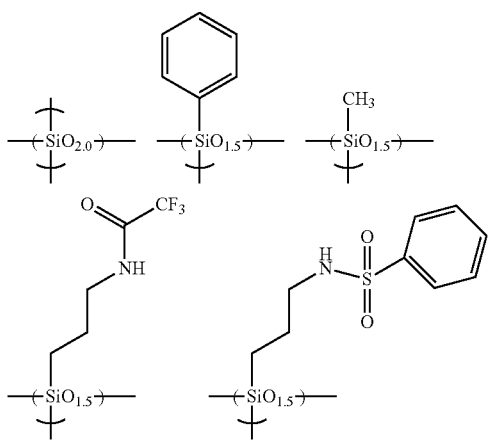

Formula (2-7)

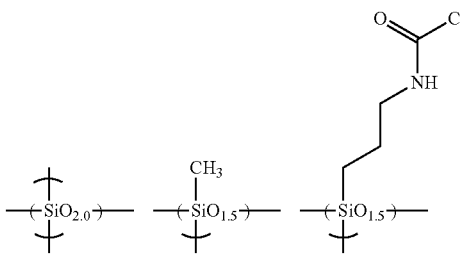

Formula (2-8)

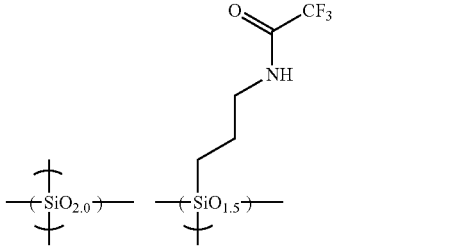

Formula (2-9)

The hydrolysis condensate (polyorganosiloxane) of the hydrolyzable silane having a weight average molecular weight of 1,000 to 1,000,000, or 1,000 to 100,000 can be obtained. The molecular weight is a molecular weight obtained by GPC analysis in terms of polystyrene.

For example, measurement conditions of GPC are as follows: GPC equipment (trade name HLC-8220GPC, manufactured by Tosoh Co., Ltd), GPC column (trade name Shodex KF803L, KF802, and KF801, manufactured by Showa Denko KK), Column temperature 40° C., Eluent (elution solvent) tetrahydrofuran, and Flow volume (flow rate) 1.0 ml/min. The measurement can be carried out by using polystyrene (manufactured by Showa Denko KK) as a standard sample.

For hydrolysis of alkoxysilyl groups, acyloxysilyl groups, or halogenated silyl groups, 0.5 mol to 100 mol, preferably 1 mol to 10 mol of water per 1 mol of the hydrolyzable group is used.

A hydrolysis catalyst of 0.001 mol to 10 mol and preferably 0.001 mol to 1 mol per 1 mol of the hydrolyzable group can be used.

The reaction temperature at the time of the hydrolysis and condensation is usually 20° C. to 80° C.

The hydrolysis may be complete hydrolysis or may be partial hydrolysis. In other words, a hydrolysis product and a monomer may remain in the hydrolysis condensate.

A catalyst may be used at the time of the hydrolysis and condensation. Examples of the hydrolysis catalyst include a metal chelate compound, an organic acid, an inorganic acid, an organic base, and an inorganic base.

Examples of the metal chelate compound as the hydrolysis catalyst include titanium chelate compounds such as triethoxy-mono(acetylacetonato) titanium, tri-n-propoxy-mono(acetylacetonato) titanium, tri-i-propoxy-mono(acetylacetonato) titanium, tri-n-butoxy-mono(acetylacetonato) titanium, tri-sec-butoxy-mono(acetylacetonato) titanium, tri-t-butoxy-mono(acetylacetonato) titanium, diethoxy-bis(acetylacetonato) titanium, di-n-propoxy-bis(acetylacetonato) titanium, di-i-propoxy-bis(acetylacetonato) titanium, di-n-butoxy-bis(acetylacetonato) titanium, di-sec-butoxy-bis(acetylacetonato) titanium, di-t-butoxy-bis(acetylacetonato) titanium, monoethoxy-tris(acetylacetonato) titanium, mono-n-propoxy-tris(acetylacetonato) titanium, mono-i- propoxy-tris(acetylacetonato) titanium, mono-n-butoxy-tris (acetylacetonato) titanium, mono-sec-butoxy-tris(acetylacetonato) titanium, mono-t-butoxy-tris(acetylacetonato) titanium, tetrakis(acetylacetonato) titanium, triethoxy-mono (ethyl acetoacetate) titanium, tri-n-propoxy-mono(ethyl acetoacetate) titanium, tri-i-propoxy-mono(ethyl acetoacetate) titanium, tri-n-butoxy-mono(ethyl acetoacetate) titanium, tri-sec-butoxy-mono(ethyl acetoacetate) titanium, tri-t-butoxy-mono(ethyl acetoacetate) titanium, diethoxy-bis (ethyl acetoacetate) titanium, di-n-propoxy-bis(ethyl acetoacetate) titanium, di-i-propoxy-bis(ethyl acetoacetate) titanium, di-n-butoxy-bis(ethyl acetoacetate) titanium, di-sec-butoxy-bis(ethyl acetoacetate) titanium, di-t-butoxy-bis (ethyl acetoacetate) titanium, monoethoxy-tris(ethyl acetoacetate) titanium, mono-n-propoxy-tris(ethyl acetoacetate) titanium, mono-i-propoxy-tris(ethyl acetoacetate) titanium, mono-n-butoxy-tris(ethyl acetoacetate) titanium, mono-sec-butoxy-tris(ethyl acetoacetate) titanium, mono-t-butoxy-tris(ethyl acetoacetate) titanium, tetrakis(ethyl acetoacetate) titanium, mono(acetylacetonato)-tris(ethyl acetoacetate) titanium, bis (acetylacetonato)-bis(ethyl acetoacetate) titanium, and tris(acetylacetonato)-mono(ethyl acetoacetate) titanium; zirconium chelate compounds such as triethoxy-mono(acetylacetonato) zirconium, tri-n-propoxy-mono(acetylacetonato) zirconium, tri-i-propoxy-mono(acetylacetonato) zirconium, tri-n-butoxy-mono (acetylacetonato) zirconium, tri-sec-butoxy-mono (acetylacetonato) zirconium, tri-t-butoxy-mono (acetylacetonato) zirconium, diethoxy-bis(acetylacetonato) zirconium, di-n-propoxy-bis(acetylacetonato) zirconium, di-i-propoxy-bis(acetylacetonato) zirconium, di-n-butoxy-bis (acetylacetonato) zirconium, di-sec-butoxy-bis(acetylacetonato) zirconium, di-t-butoxy-bis(acetylacetonato) zirconium, monoethoxy-tris(acetylacetonato) zirconium, mono-n-propoxy-tris(acetylacetonato) zirconium, mono-i-propoxy-tris(acetylacetonato) zirconium, mono-n-butoxy-tris(acetylacetonato) zirconium, mono-sec-butoxy-tris (acetylacetonato) zirconium, mono-t-butoxy-tris (acetylacetonato) zirconium, tetrakis(acetylacetonato) zirconium, triethoxy-mono(ethyl acetoacetate) zirconium, tri-n-propoxy-mono(ethyl acetoacetate) zirconium, tri-i-propoxy-mono(ethyl acetoacetate) zirconium, tri-n-butoxy-mono(ethyl acetoacetate) zirconium, tri-sec-butoxy-mono (ethyl acetoacetate) zirconium, tri-t-butoxy-mono(ethyl acetoacetate) zirconium, diethoxy-bis(ethyl acetoacetate) zirconium, di-n-propoxy-bis(ethyl acetoacetate) zirconium, di-i-propoxy-bis(ethyl acetoacetate) zirconium, di-n-butoxy-bis(ethyl acetoacetate) zirconium, di-sec-butoxy-bis (ethyl acetoacetate) zirconium, di-t-butoxy-bis(ethyl acetoacetate) zirconium, monoethoxy-tris(ethyl acetoacetate) zirconium, mono-n-propoxy-tris(ethyl acetoacetate) zirconium, mono-i-propoxy-tris(ethyl acetoacetate) zirconium, mono-n-butoxy-tris(ethyl acetoacetate) zirconium, mono-sec-butoxy-tris(ethyl acetoacetate) zirconium, mono-t-butoxy-tris(ethyl acetoacetate) zirconium, tetrakis(ethyl acetoacetate) zirconium, mono(acetylacetonato)-tris(ethyl acetoacetate) zirconium, bis(acetylacetonato)-bis(ethyl acetoacetate) zirconium, and tris(acetylacetonato)-mono (ethyl acetoacetate) zirconium; and aluminum chelate compounds such as tris(acetylacetonato) aluminum and tris (ethyl acetoacetate) aluminum.

Examples of the organic acid as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, and tartaric acid.

Examples of the inorganic acid as the hydrolysis catalyst include hydrochloric acid, nitric acid, sulfuric acid, hydrofluoric acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethyl-monoethanolamine, monomethyl-diethanolamine, triethanolamine, diazabicyclooctane, diazabicyclononane, diazabicycloundecene, and tetramethylammonium hydroxide. Examples of the inorganic base include ammonia, sodium hydroxide, potassium hydroxide, barium hydroxide, and calcium hydroxide. Among these catalysts, the metal chelate compound, the organic acid, and the inorganic acid are preferable, and these catalysts may be used singly or in combination of two or more of them.

Examples of the organic solvent used for the hydrolysis include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monoalcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenyl methyl carbinol, diacetone alcohol, and cresol; polyalcohol solvents such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents such as acetone, methylethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyl-dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methxoybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol di-acetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propane sultone. These solvents can be used singly or in combination of two or more of them.

In particular, the following ketone solvents are preferable from the viewpoint of storage stability of the obtained solution: acetone, methylethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, methylcyclohexanone, 2,4-pentanedione, acetonylacetone, diacetone alcohol, acetophenone, and fenchone.

Bisphenol S or a bisphenol S derivative can be added as an additive. The bisphenol S or the bisphenol S derivative is added in an amount of 0.01 part by mass to 20 parts by mass, 0.01 part by mass to 10 parts by mass, or 0.01 part by mass to 5 parts by mass relative to 100 parts by mass of the polyorganosiloxane.

The preferable bisphenol S or bisphenol S derivatives are exemplified below.

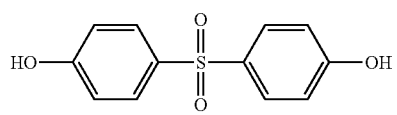

Formula (C-1)

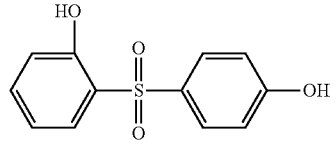

Formula (C-2)

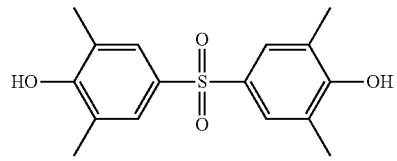

Formula (C-3)

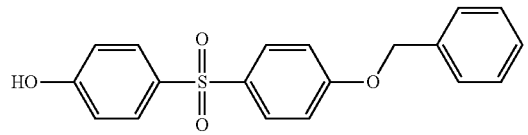

Formula (C-4)

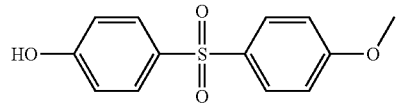

Formula (C-5)

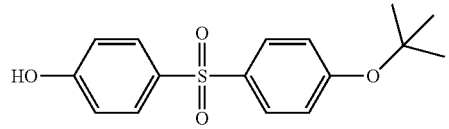

Formula (C-6)

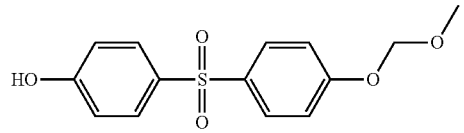

Formula (C-7)

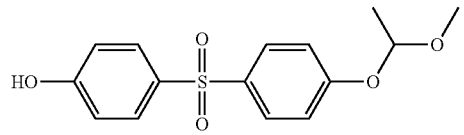

Formula (C-8)

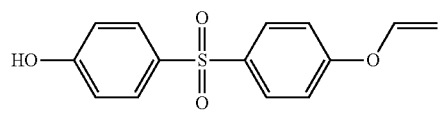

Formula (C-9)

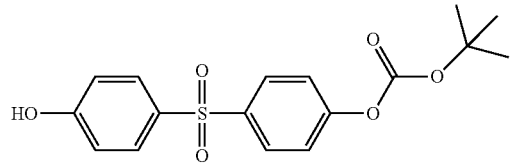

Formula (C-10)

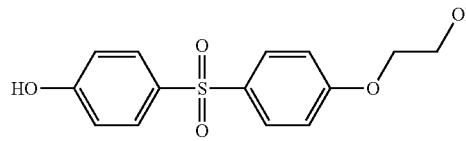

Formula (C-11)

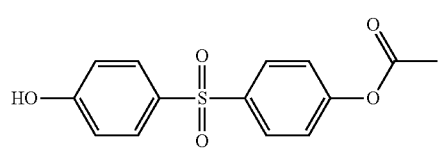

Formula (C-12)

Formula (C-13)
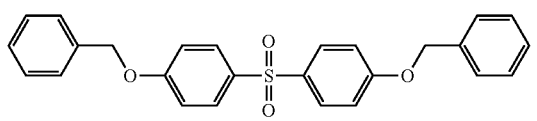

Formula (C-14)
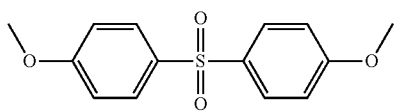

Formula (C-15)
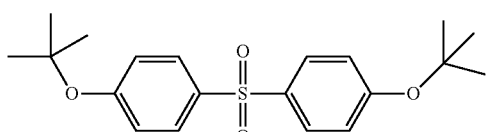

Formula (C-16)
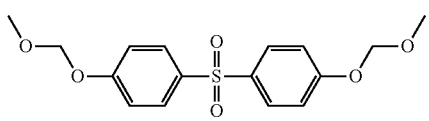

Formula (C-17)
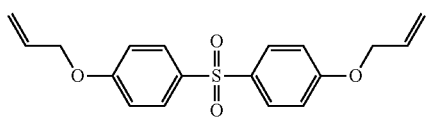

Formula (C-18)
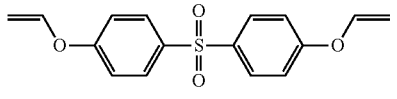

Formula (C-19)
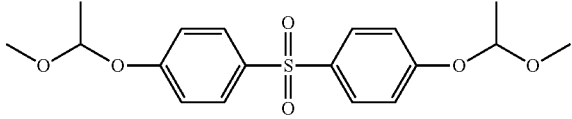

Formula (C-20)
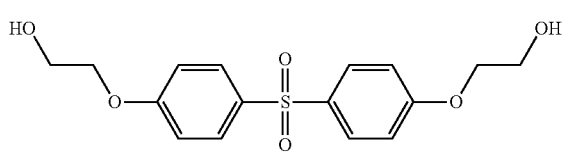

Formula (C-21)
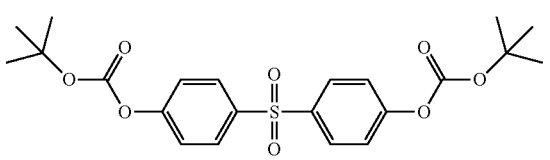

Formula (C-22)
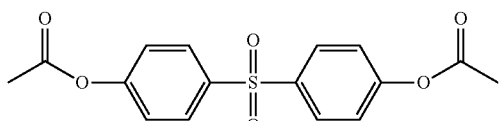

Formula (C-23)
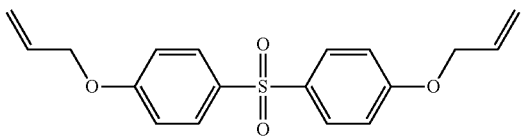

The resist underlayer film forming composition for lithography of the present invention may contain a curing catalyst. The curing catalyst acts as a curing catalyst when a coating film containing a polyorganosiloxane made of the hydrolysis condensate is heated and cured.

Examples of the usable curing catalyst include ammonium salts, phosphines, phosphonium salts, and sulfonium salts.

Examples of the ammonium salts include a quaternary ammonium salt having a structure of Formula (D-1):

Formula (D-1)
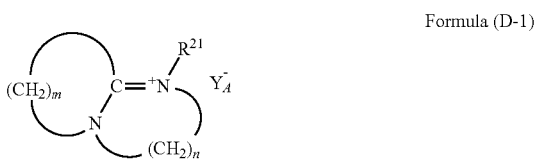

(wherein m is an integer of 2 to 11; n is an integer of 2 or 3; $R^{21}$ is an alkyl group or an aryl group; and $Y_A^-$ is an anion), a quaternary ammonium salt having a structure of Formula (D-2):

$$R^{22}R^{23}R^{24}R^{25}N^+Y_A^-$$  Formula (D-2)

(wherein $R^{22}$, $R^{23}$, $R^{24}$, and $R^{25}$ are alkyl groups or aryl groups; N is a nitrogen atom, $Y_A^-$ is an anion; and $R^{22}$, $R^{23}$, $R^{24}$, and $R^{25}$ each are bonded to the nitrogen group through a C—N bond), a quaternary ammonium salt having a structure of Formula (D-3):

Formula (D-3)

(wherein $R^{26}$ and $R^{27}$ are alkyl groups or aryl groups, and $Y_A^-$ is an anion), a quaternary ammonium salt having a structure of Formula (D-4):

Formula (D-4)
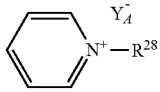

(wherein $R^{28}$ is an alkyl group or an aryl group, and $Y_A^-$ is an anion), a quaternary ammonium salt having a structure of Formula (D-5):

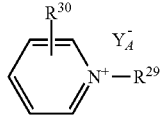
Formula (D-5)

(wherein $R^{29}$ and $R^{30}$ are alkyl groups or aryl groups, and $Y_A^-$ is an anion), and a tertiary ammonium salt having a structure of Formula (D-6):

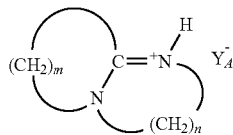
Formula (D-6)

(wherein m is an integer of 2 to 11; n is an integer of 2 or 3; H is a hydrogen atom; and $Y_A^-$ is an anion).

Examples of the phosphonium salts include a quaternary phosphonium salt of Formula (D-7):

(wherein $R^{31}$, $R^{32}$, $R^{33}$, and $R^{34}$ are alkyl groups or aryl groups; P is a phosphorus atom; $Y_A^-$ is an anion, and $R^{31}$, $R^{32}$, $R^{33}$, and $R^3$ each are bonded to the phosphorus atom through a C—P bond).

Examples of the sulfonium salts include a tertiary sulfonium salt of Formula (D-8):

(wherein $R^{35}$, $R^{36}$, and $R^{37}$ are alkyl groups or aryl groups; S is a sulfur atom; $Y_A^-$ is an anion, and $R^{35}$, $R^{36}$, and $R^{37}$ each are bonded to the sulfur atom through a C—S bond).

The compound of Formula (D-1) is a quaternary ammonium salt derived from an amine. m is an integer of 2 to 11 and n is an integer of 2 or 3. $R^{21}$ in the quaternary ammonium salt is a $C_{1-18}$ alkyl group or aryl group and preferably a $C_{2-10}$ alkyl group or aryl group. Examples of $R^{21}$ include linear alkyl groups such as ethyl group, propyl group, and butyl group; and benzyl group, cyclohexyl group, cyclohexylmethyl group, and dicyclopentadienyl group. Examples of the anion ($Y_A^-$) include halogen ions such as chlorine ion (Cl$^-$), bromide ion (Br$^-$), and iodide ion (I$^-$), and acid groups such as carboxylate (—COO$^-$), sulfonate (—SO$_3^-$), and alcoholate (—O$^-$).

The compound of Formula (D-2) is a quaternary ammonium salt of $R^{22}R^{23}R^{24}R^{25}N^+Y_A^-$. $R^{22}$, $R^{23}$, $R^{24}$, and $R^{25}$ in the quaternary ammonium salt are $C_{1-18}$ alkyl groups or aryl groups, or silane compounds bonding to a silicon atom through a Si—C bond. Examples of the anion ($Y_A^-$) include halogen ions such as chlorine ion (Cl$^-$), bromide ion (Br$^-$), and iodide ion (I$^-$), and acid groups such as carboxylate (—COO$^-$), sulfonate (—SO$_3^-$), and alcoholate (—O$^-$). The quaternary ammonium salt is commercially available and examples of the quaternary ammonium salt include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from 1-substituted imidazole. $R^{26}$ and $R^{27}$ are $C_{1-18}$ alkyl groups or aryl groups. The total carbon atoms of $R^{26}$ and $R^{27}$ are preferably 7 or more. Examples of $R^{26}$ include methyl group, ethyl group, propyl group, phenyl group, and benzyl group and examples of $R^{27}$ include benzyl group, octyl group, and octadecyl group. Examples of the anion ($Y_A^-$) include halogen ions such as chlorine ion (Cl$^-$), bromide ion (Br$^-$), and iodide ion (I$^-$), and acid groups such as carboxylate (—COO$^-$), sulfonate (—SO$_3^-$), and alcoholate (—O$^-$).

The compound is commercially available, or can be produced by reacting, for example, an imidazole-based compound such as 1-methylimidazole and 1-benzylimidazole with a halogenated alkyl or a halogenated aryl such as benzyl bromide and methyl bromide.

The compound of Formula (D-4) is a quaternary ammonium salt derived from pyridine. $R^{28}$ is a $C_{1-18}$ alkyl group or aryl group and preferably a $C_{4-18}$ alkyl group or aryl group. Examples of $R^{28}$ include butyl group, octyl group, benzyl group, and lauryl group. Examples of the anion ($Y_A^-$) include halogen ions such as chlorine ion (Cl$^-$), bromide ion (Br$^-$), and iodide ion (I$^-$), and acid groups such as carboxylate (—COO$^-$), sulfonate (—SO$_3^-$), and alcoholate (—O$^-$). The compound is commercially available, or can be manufactured by reacting, for example, pyridine with a halogenated alkyl or a halogenated aryl such as lauryl chloride, benzyl chloride, benzyl bromide, methyl bromide, and octyl bromide. Examples of the compound include N-laurylpyridinium chloride and N-benzylpyridinium bromide.

The compound of Formula (D-5) is a quaternary ammonium salt derived from a substituted pyridine as represented by picoline and the like. $R^{29}$ is a $C_{1-18}$ alkyl group or aryl group and preferably a $C_{4-18}$ alkyl group or aryl group. Examples of $R^{29}$ include methyl group, octyl group, lauryl group, and benzyl group. $R^{30}$ is a $C_{1-18}$ alkyl group or aryl group. For example, $R^{30}$ is methyl group when the compound is a quaternary ammonium derived from picoline. Examples of the anion ($Y_A^-$) include halogen ions such as chlorine ion (Cl$^-$), bromide ion (Br$^-$), and iodide ion (I$^-$), and acid groups such as carboxylate (—COO$^-$), sulfonate (—SO$_3^-$), and alcoholate (—O$^-$). The compound is commercially available, or can be manufactured by reacting, for example, a substituted pyridine such as picoline with a halogenated alkyl or a halogenated aryl such as methyl bromide, octyl bromide, lauryl chloride, benzyl chloride, and benzyl bromide. Examples of the compound include N-benzylpicolinium chloride, N-benzylpicolinium bromide, and N-laurylpicolinium chloride.

The compound of Formula (D-6) is a tertiary ammonium salt derived from an amine. m is an integer of 2 to 11 and n is an integer of 2 or 3. Examples of the anion ($Y_A^-$) include halogen ions such as chlorine ion (Cl$^-$), bromide ion (Br$^-$), and iodide ion (I$^-$), and acid groups such as carboxylate (—COO$^-$), sulfonate (—SO$_3^-$), and alcoholate (—O$^-$). The compound can be produced by reacting an amine with a weak acid such as a carboxylic acid and phenol. Examples of the carboxylic acid include formic acid and acetic acid. When formic acid is used, the anion ($Y_A^-$) is (HCOO$^-$), and when acetic acid is used, the anion ($Y_A^-$) is (CH$_3$COO$^-$). When phenol is used, the anion ($Y_A^-$) is (C$_6$H$_5$O$^-$).

The compound of Formula (D-7) is a quaternary phosphonium salt having a structure of $R^{31}R^{32}R^{33}R^{34}P^+Y_A^-$. $R^{31}$, $R^{32}$, $R^{33}$, and $R^{34}$ are $C_{1-18}$ alkyl groups or aryl groups, or silane compounds bonding to a silicon atom through a Si—C bond. Preferably three out of the four substituents of $R^{31}$ to $R^{34}$ are phenyl groups or substituted phenyl groups, and examples of the phenyl group or substituted phenyl group include phenyl group and tolyl group. Remaining one substituent is a $C_{1-18}$ alkyl group, an aryl group, or a silane compound bonding to a silicon atom through a Si—C bond. Examples of the anion ($Y_A^-$) include halogen ions such as chlorine ion (Cl$^-$), bromide ion (Br$^-$), and iodide ion (I$^-$), and acid groups such as carboxylate (—COO$^-$), sulfonate (—SO$_3^-$), and alcoholate (—O$^-$). The compound is commercially available and examples of the compound include halogenated tetraalkylphosphoniums such as halogenated tetra-n-butylphosphoniums and halogenated tetra-n-propylphosphoniums; halogenated trialkylbenzylphosphoniums such as halogenated triethylbenzylphosphoniums; halogenated triphenyl-mono-alkylphosphoniums such as halogenated triphenylmethylphosphoniums and halogenated triphenylethylphosphoniums; halogenated triphenylbenzylphosphoniums, halogenated tetraphenylphosphoniums, halogenated tritolyl-mono-arylphosphoniums, and halogenated tritolyl-mono-alkylphosphoniums (the halogen atom is a chlorine atom or a bromine atom). Particularly preferable examples include halogenated triphenyl-mono-alkylphosphoniums such as halogenated triphenylmethylphosphoniums and halogenated triphenylethylphosphoniums; halogenated triphenyl-mono-arylphosphoniums such as halogenated triphenylbenzylphosphoniums; halogenated tritolyl-mono-arylphosphoniums such as halogenated tritolyl-mono-phenylphosphoniums; and halogenated tritolyl-mono-alkylphosphoniums such as halogenated tritolyl-mono-methylphosphoniums (the halogen atom is a chlorine atom or a bromine atom).

Examples of the phosphines include primary phosphines such as methylphosphine, ethylphosphine, propylphosphine, isopropylphosphine, isobutylphosphine, and phenylphosphine; secondary phosphines such as dimethylphosphine, diethylphosphine, diisopropylphosphine, diisoamylphosphine, and diphenylphosphine; and tertiary phosphines such as trimethylphosphine, triethylphosphine, triphenylphosphine, methyldiphenylphosphine, and dimethylphenylphosphine.

The compound of Formula (D-8) is a tertiary sulfonium salts having a structure of $R^{35}R^{36}R^{37}S^+Y_A^-$. $R^{35}$, $R^{36}$, and $R^{37}$ are $C_{1-18}$ alkyl groups or aryl groups, or silane compounds bonding to a silicon atom through a Si—C bond. Preferably three out of the four substituents of $R^{35}$ to $R^{37}$ are phenyl groups or substituted phenyl groups, and examples of the phenyl groups or substituted phenyl groups include phenyl group and tolyl group. Remaining one substituent is a $C_{1-18}$ alkyl group or an aryl group. Examples of the anion ($Y_A^-$) include halogen ions such as chlorine ion (Cl$^-$), bromide ion (Br$^-$), and iodide ion (I$^-$), and acid groups such as carboxylate (—COO$^-$), sulfonate (—SO$_3^-$), alcoholate (—O$^-$), maleic acid anion, and nitric acid anion. The compound is commercially available and examples of the compound include halogenated tetraalkylsulfoniums such as halogenated tri-n-butylsulfoniums and halogenated tri-n-propylsulfoniums; halogenated trialkylbenzylsulfoniums such as halogenated diethylbenzylsulfoniums; halogenated diphenyl-mono-alkyl sulfoniums such as halogenated diphenylmethylsulfoniums and halogenated diphenylethylsulfoniums; halogenated triphenylsulfoniums (the halogen atom is a chlorine atom or bromine atom), tetraalkylphosphonium carboxylates such as tri-n-butylsulfonium carboxylate and tri-n-propylsulfonium carboxylate; trialkylbenzylsulfonium carboxylates such as diethylbenzylsulfonium carboxylate; diphenyl-mono-alkylsulfonium carboxylates such as diphenylmethylsulfonium carboxylate and diphenylethylsulfonium carboxylate; and triphenylsulfonium carboxylate. The halogenated triphenylsulfonium and the triphenylsulfonium carboxylate are preferably used.

In the present invention, a nitrogen-containing silane compound can be added as the curing catalyst. Examples of the nitrogen-containing silane compound include imidazole ring-containing silane compounds such as N-(3-triethoxysilylpropyl)-4,5-dihydroimidazole.

The amount of the curing catalyst is 0.01 part by mass to 10 parts by mass, 0.01 part by mass to 5 parts by mass, or 0.01 part by mass to 3 parts by mass relative to 100 parts by mass of the polyorganosiloxane.

The hydrolyzable silane is hydrolyzed and condensed in the solvent using the catalyst. From the obtained mixture of hydrolysis condensate (a polymer), alcohols as by-products and the hydrolysis catalyst and water used can be simultaneously removed by distillation under reduced pressure or other operations. The acid catalyst and the base catalyst used for the hydrolysis can be removed by neutralization or ion exchange.

To the resist underlayer film forming composition for lithography of the present invention, an organic acid, water, an alcohol, or a combination thereof can be added in order to stabilize the resist underlayer film forming composition having the hydrolysis condensate.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid, maleic acid, and the like are preferable. The amount of the organic acid to be added is 0.1 part by mass to 5.0 parts by mass relative to 100 parts by mass of the condensate (polyorganosiloxane). As the water to be added, pure water, ultrapure water, ion-exchanged water, and the like can be used. The amount of the water to be added can be 1 part by mass to 20 parts by mass relative to 100 parts by mass of the resist underlayer film forming composition.

As the alcohol to be added, an alcohol that is easy to be evaporated by heating after application is preferable. Examples of the alcohol include methanol, ethanol, propanol, isopropanol, and butanol. The amount of the alcohol to be added can be 1 part by mass 20 to 20 parts by mass relative to 100 parts by mass of the resist underlayer film forming composition.

In addition to the above components, the underlayer film forming composition for lithography of the present invention may contain, for example, an organic polymer compound, an photoacid generator, and a surfactant, if necessary.

Use of the organic polymer compound allows a dry etching rate (a decreased amount in film thickness per unit time), an attenuation coefficient, and a refractive index of the resist underlayer film formed from the underlayer film forming composition for lithography of the present invention to be adjusted.

The organic polymer compound is not particularly limited and various organic polymers can be used. Condensation polymerization polymers and addition polymerization polymers, and the like can be used. The addition polymerization polymers and the condensation polymerization polymers such as polyesters, polystyrenes, polyimides, acrylic polymers, methacrylic polymers, polyvinyl ethers, phenol novolacs, naphthol novolacs, polyether, polyamides, and polycarbonates can be used. Organic polymers having an aromatic ring structure such as a benzene ring, a naphthalene ring, an anthracene ring, a triazine ring, a quinoline ring, and a quinoxaline ring that function as a light absorbing moiety are preferably used.

In the case where the organic polymer compound contains hydroxy groups, these hydroxy groups can form a cross-linking reaction with the polyorganosiloxane.

As the organic polymer compound, the polymer compound having a weight average molecular weight of, for example, 1,000 to 1,000,000, 3,000 to 300,000, 5,000 to 200,000, or 10,000 to 100,000 can be used.

The organic polymer compounds can be used singly or in combination of two or more of them.

When the organic polymer compound is used, a ratio of the organic polymer compound is 1 part by mass to 200 parts by mass, 5 parts by mass to 100 parts by mass, 10 parts by mass to 50 parts by mass, or 20 parts by mass to 30 parts by mass relative to 100 parts by mass of the condensate (polyorganosiloxane).

The resist underlayer film forming composition for lithography of the present invention may contain an acid generator.

Examples of the acid generator include a thermal acid generator and a photoacid generator.

The photoacid generator generates an acid at the time of exposure of the resist. Therefore, the acidity of the underlayer film can be adjusted. This is one method for adjusting the acidity of the underlayer film to the acidity of the resist of the upper layer. The pattern shape of the resist formed on the upper layer can be controlled by adjusting the acidity of the underlayer film.

Examples of the photoacid generator contained in the resist underlayer film forming composition of the present invention include onium salt compounds, sulfonimide compounds, and disulfonyldiazomethane compounds.

Examples of the onium salt compounds include iodonium salt compounds such as diphenyliodonium hexafluorophosphate, diphenyliodonium trifluoromethanesulfonate, diphenyliodonium nonafluoro-normal-butanesulfonate, diphenyliodonium perfluoro-normal-octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds such as triphenylsulfonium hexafluoroantimonate, triphenylsulfonium nonafluoro-normal-butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro-normal-butanesulfonyloxy)succinimide, N-(camphorsulfonyloxy)succinimide, and N-(trifluoromethanesulfonyloxy)naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photoacid generator can be used singly or can be used in combination of two or more of them.

When the photoacid generator is used, a ratio thereof is 0.01 part by mass to 15 parts by mass, 0.1 part by mass to 10 parts by mass, or 0.5 part by mass to 1 part by mass relative to 100 parts by mass of the condensate (polyorganosiloxane).

A surfactant is effective for reducing generation of pinholes and striations when the resist underlayer film forming composition for lithography of the present invention is applied to the substrate.

Examples of the surfactant contained in the resist underlayer film forming composition of the present invention include nonionic surfactants such as polyoxyethylene alkyl ethers such as polyoxyethylene lauryl ethers, polyoxyethylene stearyl ethers, polyoxyethylene cetyl ethers, and polyoxyethylene oleyl ethers; polyoxyethylene alkylaryl ethers such as polyoxyethylene octylphenol ethers and polyoxyethylene nonylphenol ethers; polyoxyethylene-polyoxypropylene block copolymers; sorbitan fatty acid esters such as sorbitan monolaurates, sorbitan monopalmitates, sorbitan monostearates, sorbitan monooleates, sorbitan trioleates, and sorbitan tristearates; and polyoxyethylene sorbitan fatty acid esters such as polyoxyethylene sorbitan monolaurates, polyoxyethylene sorbitan monopalmitates, polyoxyethylene sorbitan monostearates, polyoxyethylene sorbitan trioleates, and polyoxyethylene sorbitan tristearates; fluorochemical surfactants such as Eftop EF301, EF303, and EF352 (trade name, manufactured by TOHKEM PRODUCTS CORPORATION), Megafac F171, F173, R-08, R-30, R-30N, and R-40LM (trade name, manufactured by DIC Corporation), Fluorad FC430 and FC431 (manufactured by Sumitomo 3M Ltd.), Asahi guard AG710, Surflon S-382, SC101, SC102, SC103, SC104, SC105, and SC106 (manufactured by Asahi Glass Co., Ltd.); and Organosiloxane Polymer KP341 (manufactured by Shin-Etsu Chemical Co., Ltd.). These surfactants can be used singly or can be used in combination of two or more of them. When the surfactant is used, the ratio of the surfactant is 0.0001 part by mass to 5 parts by mass, 0.001 part by mass to 1 part by mass, or 0.01 part by mass to 1 part by mass relative to 100 parts by mass of the condensate (polyorganosiloxane).

The resist underlayer film forming composition for lithography of the present invention can also contain, for example, a rheology modifier and an adhesion assistance agent. The rheology modifier is effective for improving flowability of the underlayer film forming composition. The adhesion assistance agent is effective for improving adhesion of the underlayer film with the semiconductor substrate or the resist.

As a solvent used for the resist underlayer film forming composition for lithography of the present invention, any solvent can be used without limitation as long as the solvent can dissolve the solid content. Examples of the solvent include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methyl propionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents can be used singly or in combination of two or more of them.

Hereinafter, the use of the resist underlayer film forming composition for lithography of the present invention will be described.

In order to process a substrate using the resist underlayer film forming composition of the present invention, a resist underlayer film is formed on the substrate by a coating method or a resist underlayer film is formed through an organic underlayer film on the substrate by the coating method, and a resist film (for example, a photoresist, an electron beam resist, or an EUV resist) is formed on the resist underlayer film. Thereafter, a resist pattern is formed by exposure and development and the pattern is transferred by dry-etching the resist underlayer film using the resist pattern. The substrate is processed using the pattern or the pattern is transferred by etching the organic underlayer film and the substrate is processed using the organic underlayer film.

For forming a fine pattern, the thickness of the resist film tends to become thin in order to prevent pattern collapse. In the dry etching for transferring the pattern to a film existing at the underlayer, the pattern cannot be transferred unless the etching rate is higher than that of the upper layer film due to the thinning of the resist. In this respect, the resist underlayer film formed from the resist underlayer film forming composition for lithography of the present invention has a higher dry etching rate than that of the resist.

In the present invention, the substrate is coated with the resist underlayer film (containing an inorganic silicon-based compound) according to the present invention through the organic underlayer film or not through the organic underlayer film and the resist underlayer film is coated with the resist film (an organic resist film) in this order. Generally, the dry etching rate of the film formed of organic components and the dry etching rate of the film formed of inorganic components are significantly different depending on the selection of the etching gas. The film formed of the organic components has a higher dry etching rate when an oxygen-based gas is used, whereas the film formed of the inorganic components has a higher dry etching rate when a halogen-containing gas is used.

Accordingly, for example, the resist pattern is formed, the resist underlayer film according to the present invention existing at the underlayer of the resist is dry-etched with the halogen-containing gas to transfer the pattern to the resist underlayer film, and the substrate is processed with the halogen-containing gas using the pattern transferred to the resist underlayer film. Alternatively, the pattern is transferred by dry-etching the organic underlayer film at the underlayer of the resist underlayer film with the oxygen-based gas using the pattern-transferred resist underlayer film and the substrate is processed with the halogen-containing gas using the pattern-transferred organic underlayer film.

Hereinafter, the use will be described in more detail.

The resist underlayer film is formed by applying the resist underlayer film forming composition of the present invention onto the substrate (for example, a silicon wafer substrate, a silicon/silicon dioxide coated substrate, a silicon nitride substrate, a glass substrate, an ITO substrate, a polyimide substrate, and a low dielectric constant material (low-k material) coated substrate) used in the production of semiconductor devices by an appropriate coating method such as a spinner or a coater and thereafter baking the applied composition. The baking conditions are appropriately selected from a baking temperature of 80° C. to 250° C. and a baking time of 0.3 minute to 60 minutes. The preferable conditions are a baking temperature of 150° C. to 250° C. and a baking time of 0.5 minute to 2 minutes. The film thickness of the underlayer film to be formed is, for example, 10 nm to 1,000 nm, 20 nm to 500 nm, 50 nm to 300 nm, or 100 nm to 200 nm.

Subsequently, for example, the layer of a photoresist is formed on the resist underlayer film. The photoresist layer can be formed by a known method, that is, applying a photoresist composition solution onto the underlayer film and baking the applied composition. The thickness of the photoresist is, for example, 50 nm to 10,000 nm, 100 nm to 2,000 nm, or 200 nm to 1,000 nm.

In the present invention, after the organic underlayer film is formed on the substrate, the resist underlayer film of the present invention is formed on the organic underlayer film and a photoresist can be further formed on the resist underlayer film. Therefore, even when a photoresist pattern has a narrow width and the photoresist is thinly applied in order to prevent the pattern collapse, the substrate can be processed by appropriately selecting an etching gas. For example, the resist underlayer film of the present invention can be processed by using a fluorine-based gas, which has a sufficiently higher etching rate than that of the photoresist, as the etching gas. The organic underlayer film can be processed by using the oxygen-based gas, which has a sufficiently higher etching rate than that of the resist underlayer film of the present invention, as the etching gas. The substrate can be processed by using the fluorine-based gas, which has a sufficiently higher etching rate than that of the organic underlayer film, as the etching gas.

The photoresist formed on the resist underlayer film of the present invention is not limited as long as the photoresist is sensitive to the light used for exposure. Both negative type photoresists and positive type photoresists can be used. Examples of the photoresist include a positive type photoresist made of a novolac resin and 1,2-naphthoquinonediazide sulfonic acid ester, a chemically amplified photoresist made of a binder having a group decomposed with an acid to increase an alkali dissolution rate and a photoacid generator, a chemically amplified photoresist made of a low molecular compound decomposed with an acid to increase an alkali dissolution rate of the photoresist, an alkali-soluble binder, and a photoacid generator, and a chemically amplified photoresist made of a binder having a group decomposed with an acid to increase an alkali dissolution rate, a low molecular compound decomposed with an acid to increase an alkali dissolution rate of the photoresist, and a photoacid generator. Examples of commercially available photoresists include APEX-E (trade name, manufactured by Shipley Company L.L.C.), PAR710 (trade name, manufactured by Sumitomo Chemical Company, Limited), and SEPR430 (trade name, manufactured by Shin-Etsu Chemical Co., Ltd.). In addition, fluorine atom-containing polymer-based photoresists as described in Proc. SPIE, Vol. 3999, 330-334 (2000), Proc. SPIE, Vol. 3999, 357-364 (2000), and Proc. SPIE, Vol. 3999, 365-374 (2000) can be included.

Subsequently, exposure to light is carried out through the predetermined mask. A KrF excimer laser (a wavelength of 248 nm), an ArF excimer laser (a wavelength of 193 nm), an $F_2$ excimer laser (a wavelength of 157 nm), EUV, and the like can be used for the exposure. After exposure, post exposure bake can be carried out, if necessary. The post exposure baking is carried out under appropriately selected conditions of a heating temperature of 70° C. to 150° C. and a heating time of 0.3 minute to 10 minutes.

In the present invention, a resist for electron beam lithography or a resist for EUV lithography can be used as a resist instead of the photoresist. Both negative type electron beam resists and positive type electron beam resists can be used. Examples of the electron beam resist include a chemically amplified resist made of an acid generator and a binder having a group decomposed with an acid to change an alkali dissolution rate, a chemically amplified resist made of an alkali soluble binder, an acid generator, and a low molecular compound decomposed with an acid to change an alkali dissolution rate of the resist, a chemically amplified resist made of an acid generator, a binder having a group decomposed with an acid to change an alkali dissolution rate, and a low molecular compound decomposed with an acid to change an alkali dissolution rate of the resist, a non-chemically amplified resist made of a binder having a group decomposed with electron beams to change an alkali dissolution rate, and a non-chemically amplified resist made of a binder having a moiety that is cut by electron beams to change the alkali dissolution rate. When these electron beam resists are used, similar to the case where photoresist is used, a resist pattern can be formed by using electron beams as an irradiation source.

As the EUV resist, a methacrylate resin-based resist, a methacrylate-polyhydroxystyrene hybrid resin-based resist, and a polyhydroxystyrene resin-based resist can be used. Both a negative type EUV resist and a positive type EUV resist can be used. Examples of the EUV resist include a chemically amplified resist made of an acid generator and a binder having a group decomposed with an acid to change an alkali dissolution rate, a chemically amplified resist made of an alkali soluble binder, an acid generator, and a low molecular compound decomposed with an acid to change an alkali dissolution rate of the resist, a chemically amplified resist made of an acid generator, a binder having a group decomposed with an acid to change an alkali dissolution rate, and a low molecular compound decomposed with an acid to change an alkali dissolution rate of the resist, a non-chemically amplified resist made of a binder having a group decomposed with EUV light to change an alkali dissolution rate, and a non-chemically amplified resist made of a binder having a moiety that is cut by EUV light to change the alkali dissolution rate.

Subsequently, development is carried out with a development solution (for example, an alkali development solution). This allows an exposed part of the photoresist to be removed to form a pattern of the photoresist when, for example, a positive type photoresist is used. Examples of the development solution include aqueous alkali solutions including aqueous solutions of alkali metal hydroxides such as potassium hydroxide and sodium hydroxide, aqueous solutions of quaternary ammonium hydroxides such as tetramethylammonium hydroxide, tetraethylammonium hydroxide, and choline, and aqueous solutions of amines such as ethanolamine, propylamine, and ethylenediamine. In addition, a surfactant and the like can be added to the development solution. The development conditions are appropriately selected from a temperature of 5° C. to 50° C. and a time of 10 seconds to 600 seconds.

In the present invention, organic solvents can be used as the development solution. After exposure to light, development is carried out with a development solution (a solvent). This allows an unexposed part of the photoresist to be removed to form a pattern of the photoresist when, for example, a positive type photoresist is used.

Examples of the development solution include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. In addition, a surfactant and the like can be added to the development solution. The development conditions are appropriately selected from a temperature of 5° C. to 50° C. and a time of 10 seconds to 600 seconds.

After patterning the photoresist film by development, the part of the resist underlayer film (intermediate layer) of the present invention, where the photoresist film (upper layer) is removed, is removed by dry etching to expose the substrate. Examples of gases to be used for dry etching of the resist underlayer film of the present invention include tetrafluoromethane ($CF_4$), trifluoromethane ($CHF_3$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, and trichloroborane and dichloroborane. For the dry etching of the resist underlayer film, it is preferable to use the halogen-based gas. The photoresist made of organic substances is basically difficult to be removed by dry etching using the halogen-based gas. On the contrary, the resist underlayer film of the present invention that contains many silicon atoms is rapidly removed by the halogen-based gas. Therefore, reduction in the film thickness of the photoresist film associated with the dry etching of the resist underlayer film can be reduced. As a result, the photoresist can be used as a thin film.

Dry etching of the resist underlayer film is preferably carried out by a fluorine-based gas. Examples of the fluorine-based gas include tetrafluoromethane ($CF_4$), trifluoromethane ($CHF_3$), perfluorocyclobutane ($C_4F_8$), perfluoropropane ($C_3F_8$), trifluoromethane, and difluoromethane ($CH_2F_2$).

Subsequently, the semiconductor substrate is processed. The semiconductor substrate is preferably processed by dry etching with a fluorine-based gas. Examples of the fluorine-based gas include tetrafluoromethane ($CF_4$), trifluoromethane ($CHF_3$), perfluorocyclobutane ($C_4F_8$), perfluoropropane ($C_3F_8$), trifluoromethane, and difluoromethane ($CH_2F_2$).

When the organic underlayer film is formed on the substrate, the resist underlayer film (intermediate layer) of the present invention is removed using the thus formed pattern of photoresist film (upper layer) as a protection film. Subsequently, the organic underlayer film (underlayer) is removed using the patterned photoresist film (upper layer) and the resist underlayer film (intermediate layer) of the present invention as protection films. Finally, the semiconductor substrate is processed using the patterned resist underlayer film (intermediate layer) of the present invention and organic underlayer film (underlayer) as protection films.

More specifically, first, the part of the resist underlayer film (intermediate layer) of the present invention, where the photoresist film (upper layer) is removed, is removed by dry etching using the above method to expose the organic underlayer film (underlayer). Thereafter, the organic underlayer film is removed using the patterned photoresist film and film made of the resist underlayer film of the present invention as the protection films. The organic underlayer film (underlayer) is preferably dry-etched by using the oxygen-based gas. This is because the resist underlayer film of the present invention that contains many silicon atoms is difficult to be removed by dry etching with the oxygen-based gas.

Finally, the semiconductor substrate is processed. As described above, the semiconductor substrate is preferably processed by dry etching with the fluorine-based gas.

An organic anti-reflective coating can be formed at the upper layer of the resist underlayer film of the present invention before forming the photoresist film. The anti-reflective coating composition to be used is not particularly limited and can be arbitrarily selected from conventionally used anti-reflective coating compositions in lithographic processes. The anti-reflective coating can be formed by a conventionally used method, that is, a method for applying the composition by, for example, a spinner or a coater and baking the applied composition.

The substrate onto which the resist underlayer film forming composition of the present invention is applied may have an organic or inorganic anti-reflective coating formed on the surface of the substrate by a CVD method or the like. The underlayer film of the invention may also be formed on the anti-reflective coating.

The resist underlayer film formed from the resist underlayer film forming composition of the present invention may exhibit light absorption depending on the wavelength of light used in the lithography process. In such a case, the resist underlayer film functions as an anti-reflective coating having an effect of preventing reflected light from the substrate. The underlayer film of the present invention can be used as a layer for preventing interaction between the substrate and the photoresist, a layer having a function of preventing an adverse effect of materials used for the photoresist or substances generated at the time of exposure to the photoresist on a substrate, a layer having a function of preventing diffusion of substances generated from the substrate at the time of heating and baking into the upper layer photoresist, and a barrier layer for reducing the poisoning effect on the photoresist layer due to the semiconductor substrate dielectric layer.

The resist underlayer film formed from the resist underlayer film forming composition of the present invention is applicable to a substrate in which via holes used in a dual damascene process are formed and can be used as an embedding material capable of filling holes without gaps. The resist underlayer film composition can also be used as a planarizing material for planarizing the surface of a semiconductor substrate having unevenness.

In addition to the function as a hard mask, the resist underlayer film as the underlayer film of the EUV resist can also be used for the following object. The resist underlayer film forming composition can be used as an underlayer anti-reflective coating of the EUV resist, in which the underlayer anti-reflective coating does not cause intermixing with the EUV resist and can prevent reflection of undesirable exposure light such as UV or DUV (ArF light, KrF light) from the substrate or interface at the time of EUV exposure (wavelength 13.5 nm). The resist underlayer film can efficiently prevent reflection at the underlayer of the EUV resist. When the resist underlayer film is used for the EUV resist underlayer film, the process can be carried out in a similar manner to the process for the underlayer film for the photoresist.

EXAMPLES

Synthesis Example 1

Into a 300 ml flask, 24.93 g (70 mol %) of tetraethoxysilane, 1.70 g (5 mol %) of phenyltrimethoxysilane, 6.10 g (20 mol %) of triethoxymethylsilane, 2.71 g (5 mol %) of trifluoroacetamidopropyltriethoxysilane, and 53.16 g of acetone were poured and 11.40 g of 0.01 mol/l hydrochloric acid was added dropwise to the mixed solution with stirring the mixed solution using a magnetic stirrer. After the addition, the flask was transferred to an oil bath controlled to 85° C. and the solution was reacted under heating reflux for 240 minutes. Thereafter, the reaction solution was cooled to room temperature. To the reaction solution, 70.00 g of propylene glycol monomethyl ether acetate was added. Methanol, ethanol, acetone, water, and hydrochloric acid as reaction byproducts were distilled off under reduced pressure and the reaction solution was concentrated to give the propylene glycol monomethyl ether acetate solution of a hydrolysis condensate (polymer). To the solution, propylene glycol monoethyl ether was added so that the solution had a concentration of 20% by mass in terms of solid residue at 140° C. in a solvent ratio of propylene glycol monomethyl ether acetate/propylene glycol monoethyl ether of 20/80. The obtained polymer corresponded to Formula (2-1) and the weight average molecular weight Mw of the polymer measured with GPC in terms of polystyrene was 1,800.

Synthesis Example 2

Into a 300 ml flask, 26.04 g (70 mol %) of tetraethoxysilane, 6.37 g (20 mol %) of triethoxymethylsilane, 2.83 g (5 mol %) of trifluoroacetamidopropyltriethoxysilane, 2.16 g (5 mol %) of 4-methoxybenzyltrimethoxysilane, and 52.86 g of acetone were poured and 11.90 g of 0.01 mol/l hydrochloric acid was added dropwise to the mixed solution with stirring the mixed solution using a magnetic stirrer. After the addition, the flask was transferred to an oil bath controlled to 85° C. and the solution was reacted under heating reflux for 240 minutes. Thereafter, the reaction solution was cooled to room temperature. To the reaction solution, 70.00 g of propylene glycol monomethyl ether acetate was added. Methanol, ethanol, acetone, water, and hydrochloric acid as reaction byproducts were distilled off under reduced pressure and the reaction solution was concentrated to give the propylene glycol monomethyl ether acetate solution of a hydrolysis condensate (polymer). To the solution, propylene glycol monoethyl ether was added so that the solution had a concentration of 20% by mass in terms of solid residue at 140° C. in a solvent ratio of propylene glycol monomethyl ether acetate/propylene glycol monoethyl ether of 20/80. The obtained polymer corresponded to Formula (2-2) and the weight average molecular weight Mw of the polymer measured with GPC in terms of polystyrene was 1,600.

Synthesis Example 3

Into a 300 ml flask, 24.43 g (70 mol %) of tetraethoxysilane, 1.66 g (5 mol %) of phenyltrimethoxysilane, 3.88 g (13 mol %) of triethoxymethylsilane, 2.66 g (5 mol %) of trifluoroacetamidopropyltriethoxysilane, 0.81 g (2 mol %) of 4-methoxybenzyltrimethoxysilane, 2.90 g (5 mol %) of phenylsulfonylpropyltriethoxysilane, and 53.30 g acetone were poured and 11.17 g of 0.01 mol/l hydrochloric acid was added dropwise to the mixed solution with stirring the mixed solution using a magnetic stirrer. After the addition, the flask was transferred to an oil bath controlled to 85° C. and the solution was reacted under heating reflux for 240 minutes. Thereafter, the reaction solution was cooled to room temperature. To the reaction solution, 70.00 g of propylene glycol monomethyl ether acetate was added. Methanol, ethanol, acetone, water, and hydrochloric acid as reaction byproducts were distilled off under reduced pressure and the reaction solution was concentrated to give the propylene glycol monomethyl ether acetate solution of a hydrolysis condensate (polymer). To the solution, propylene glycol monoethyl ether was added so that the solution had a concentration of 20% by mass in terms of solid residue at 140° C. in a solvent ratio of propylene glycol monomethyl ether acetate/propylene glycol monoethyl ether of 20/80. The obtained polymer corresponded to Formula (2-3) and the weight average molecular weight Mw of the polymer measured with GPC in terms of polystyrene was 1,800.

Synthesis Example 4

Into a 300 ml flask, 23.68 g (70 mol %) of tetraethoxysilane, 1.61 g (5 mol %) of phenyltrimethoxysilane, 2.31 g (8 mol %) of triethoxymethylsilane, 2.58 g (5 mol %) of trifluoroacetamidopropyltriethoxysilane, 0.79 g (2 mol %) of 4-methoxybenzyltrimethoxysilane, 2.81 g (5 mol %) of phenylsulfonylpropyltriethoxysilane, 2.67 g (5 mol %) of 5-(triethoxysilyl)hexahydro-4,7-methanoisobenzofuran-1,3-dione, and 53.50 g of acetone were poured and 10.83 g of 0.01 mol/l hydrochloric acid was added dropwise to the mixed solution with stirring the mixed solution using a magnetic stirrer. After the addition, the flask was transferred to an oil bath controlled to 85° C. and the solution was reacted under heating reflux for 240 minutes. Thereafter, the reaction solution was cooled to room temperature. To the reaction solution, 70.00 g of propylene glycol monomethyl ether acetate was added. Methanol, ethanol, acetone, water, and hydrochloric acid as reaction byproducts were distilled off under reduced pressure and the reaction solution was concentrated to give the propylene glycol monomethyl ether acetate solution of a hydrolysis condensate (polymer). To the solution, propylene glycol monoethyl ether was added so that the solution had a concentration of 20% by mass in terms of solid residue at 140° C. in a solvent ratio of propylene glycol monomethyl ether acetate/propylene glycol monoethyl ether of 20/80. The obtained polymer corresponded to Formula (2-4) and the weight average molecular weight Mw of the polymer measured with GPC in terms of polystyrene was 1,700.

Synthesis Example 5

Into a 300 ml flask, 23.36 g (70 mol %) of tetraethoxysilane, 1.59 g (5 mol %) of phenyltrimethoxysilane, 2.82 g (8 mol %) of acetoxymethyltriethoxysilane, 2.54 g (5 mol %) of trifluoroacetamidopropyltriethoxysilane, 0.78 g (2 mol %) of 4-methoxybenzyltrimethoxysilane, 2.78 g (5 mol %) of phenylsulfonylpropyltriethoxysilane, 2.63 g (5 mol %) of 5-(triethoxysilyl)hexahydro-4,7-methanoisobenzofuran-1,3-dione, and 53.59 g of acetone were poured and 10.68 g of 0.01 mol/l hydrochloric acid was added dropwise to the mixed solution with stirring the mixed solution using a magnetic stirrer. After the addition, the flask was transferred to an oil bath controlled to 85° C. and the solution was reacted under heating reflux for 240 minutes. Thereafter, the reaction solution was cooled to room temperature. To the reaction solution, 70.00 g of propylene glycol monomethyl ether acetate was added. Methanol, ethanol, acetone, water, and hydrochloric acid as reaction byproducts were distilled off under reduced pressure and the reaction solution was concentrated to give the propylene glycol monomethyl ether acetate solution of a hydrolysis condensate (polymer). To the solution, propylene glycol monoethyl ether was added so that the solution had a concentration of 20% by mass in terms of solid residue at 140° C. in a solvent ratio of propylene glycol monomethyl ether acetate/propylene glycol monoethyl ether of 20/80. The obtained polymer corresponded to Formula (2-5) and the weight average molecular weight Mw of the polymer measured with GPC in terms of polystyrene was 2,100.

Synthesis Example 6

Into a 300 ml flask, 23.84 g (70 mol %) of tetraethoxysilane, 3.38 g (5 mol %) of triethoxysilylpropyldiallyl isocyanurate, 5.83 g (20 mol %) of methyltriethoxysilane, 2.59 g (5 mol %) of trifluoroacetamidopropyltriethoxysilane, and 53.46 g of acetone were poured and 10.90 g of 0.01 mol/l hydrochloric acid was added dropwise to the mixed solution with stirring the mixed solution using a magnetic stirrer. After the addition, the flask was transferred to an oil bath controlled to 85° C. and the solution was reacted under heating reflux for 240 minutes. Thereafter, the reaction solution was cooled to room temperature. To the reaction solution, 70.00 g of propylene glycol monomethyl ether acetate was added. Methanol, ethanol, acetone, water, and hydrochloric acid as reaction byproducts were distilled off under reduced pressure and the reaction solution was concentrated to give the propylene glycol monomethyl ether acetate solution of a hydrolysis condensate (polymer). To the solution, propylene glycol monoethyl ether was added so that the solution had a concentration of 20% by mass in terms of solid residue at 140° C. in a solvent ratio of propylene glycol monomethyl ether acetate/propylene glycol monoethyl ether of 20/80. The obtained polymer corresponded to Formula (2-6) and the weight average molecular weight Mw of the polymer measured with GPC in terms of polystyrene was 1,800.

Synthesis Example 7

Into a 300 ml flask, 24.74 g (70 mol %) of tetraethoxysilane, 1.68 g (5 mol %) of phenyltrimethoxysilane, 5.75 g (19.9 mol %) of methyltriethoxysilane, 2.69 g (5 mol %) of trifluoroacetamidopropyltriethoxysilane, 0.61 g (0.1 mol %) of benzenesulfonamidopropyltriethoxysilane, and 53.21 g of acetone were poured and 11.31 g of 0.01 mol/l hydrochloric acid was added dropwise to the mixed solution with stirring the mixed solution using a magnetic stirrer. After the addition, the flask was transferred to an oil bath controlled to 85° C. and the solution was reacted under heating reflux for 240 minutes. Thereafter, the reaction solution was cooled to room temperature. To the reaction solution, 70.00 g of propylene glycol monomethyl ether acetate was added. Methanol, ethanol, acetone, water, and hydrochloric acid as reaction byproducts were distilled off under reduced pressure and the reaction solution was concentrated to give the propylene glycol monomethyl ether acetate solution of a hydrolysis condensate (polymer). To the solution, propylene glycol monoethyl ether was added so that the solution had a concentration of 20% by mass in terms of solid residue at 140° C. in a solvent ratio of propylene glycol monomethyl ether acetate/propylene glycol monoethyl ether of 20/80. The obtained polymer corresponded to Formula (2-7) and the weight average molecular weight Mw of the polymer measured with GPC in terms of polystyrene was 1,800.

Synthesis Example 8

Into a 300 ml flask, 25.04 g (70 mol %) of tetraethoxysilane, 7.65 g (25 mol %) of methyltriethoxysilane, 2.72 g (5 mol %) of trifluoroacetamidopropyltriethoxysilane, and 53.13 g of acetone were poured and 11.45 g of 1 mol/l hydrochloric acid was added dropwise to the mixed solution with stirring the mixed solution using a magnetic stirrer. After the addition, the flask was transferred to an oil bath controlled to 85° C. and the solution was reacted under heating reflux for 240 minutes. Thereafter, the reaction solution was cooled to room temperature. To the reaction solution, 70.00 g of propylene glycol monomethyl ether acetate was added. Methanol, ethanol, acetone, water, and hydrochloric acid as reaction byproducts were distilled off under reduced pressure and the reaction solution was concentrated to give the propylene glycol monomethyl ether acetate solution of a hydrolysis condensate (polymer). To the solution, propylene glycol monoethyl ether was added so that the solution had a concentration of 20% by mass in terms of solid residue at 140° C. in a solvent ratio of propylene glycol monomethyl ether acetate/propylene glycol monoethyl ether of 20/80. The obtained polymer corresponded to Formula (2-8) and the weight average molecular weight Mw of the polymer measured with GPC in terms of polystyrene was 1,800.

Synthesis Example 9

Into a 300 ml flask, 21.79 g (70 mol %) of tetraethoxysilane, 14.23 g (30 mol %) of trifluoroacetamidopropyltriethoxysilane, and 54.02 g of acetone were poured and 9.96 g of 1 mol/l hydrochloric acid was added dropwise to the mixed solution with stirring the mixed solution using a magnetic stirrer. After the addition, the flask was transferred to an oil bath controlled to 85° C. and the solution was reacted under heating reflux for 240 minutes. Thereafter, the reaction solution was cooled to room temperature. To the reaction solution, 70.00 g of propylene glycol monomethyl ether acetate was added. Methanol, ethanol, acetone, water, and hydrochloric acid as reaction byproducts were distilled off under reduced pressure and the reaction solution was concentrated to give the propylene glycol monomethyl ether acetate solution of a hydrolysis condensate (polymer). To the solution, propylene glycol monoethyl ether was added so that the solution had a concentration of 20% by mass in terms of solid residue at 140° C. in a solvent ratio of propylene glycol monomethyl ether acetate/propylene glycol monoethyl ether of 20/80. The obtained polymer corresponded to Formula (2-9) and the weight average molecular weight Mw of the polymer measured with GPC in terms of polystyrene was 1,800.

Comparative Synthesis Example 1

Into a 300 ml flask, 25.81 g (70 mol %) of tetraethoxysilane, 9.47 g (30 mol %) of methyltriethoxysilane, and 52.92 g of acetone were poured and 11.80 g of 0.01 mol/l hydrochloric acid was added dropwise to the mixed solution with stirring the mixed solution using a magnetic stirrer. After the addition, the flask was transferred to an oil bath controlled to 85° C. and the solution was reacted under heating reflux for 240 minutes. Thereafter, the reaction solution was cooled to room temperature. To the reaction solution, 70.00 g of propylene glycol monomethyl ether acetate was added. Methanol, ethanol, acetone, water, and hydrochloric acid as reaction byproducts were distilled off under reduced pressure and the reaction solution was concentrated to give the propylene glycol monomethyl ether acetate solution of a hydrolysis condensate (polymer). To the solution, propylene glycol monoethyl ether was added so that the solution had a concentration of 20% by mass in terms of solid residue at 140° C. in a solvent ratio of propylene glycol monomethyl ether acetate/propylene glycol monoethyl ether of 20/80. The obtained polymer corresponded to Formula (3-1) and the weight average molecular weight Mw of the polymer measured with GPC in terms of polystyrene was 1,700.

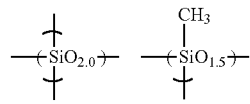

Formula (3-1)

Comparative Synthesis Example 2

Into a 300 ml flask, 25.22 g (70 mol %) of tetraethoxysilane, 7.71 g (25 mol %) of methyltriethoxysilane, 2.28 g (5 mol %) of acetamidopropyltriethoxysilane, and 52.81 g of acetone were poured and 11.53 g of 0.01 mol/l hydrochloric acid was added dropwise to the mixed solution with stirring the mixed solution using a magnetic stirrer. After the addition, the flask was transferred to an oil bath controlled to 85° C. and the solution was reacted under heating reflux for 240 minutes. Thereafter, the reaction solution was cooled to room temperature. To the reaction solution, 70.00 g of propylene glycol monomethyl ether acetate was added. Methanol, ethanol, acetone, water, and hydrochloric acid as reaction byproducts were distilled off under reduced pressure and the reaction solution was concentrated to give the propylene glycol monomethyl ether acetate solution of a hydrolysis condensate (polymer). To the solution, propylene glycol monoethyl ether was added so that the solution had a concentration of 20% by mass in terms of solid residue at 140° C. in a solvent ratio of propylene glycol monomethyl ether acetate/propylene glycol monoethyl ether of 20/80. The obtained polymer corresponded to Formula (3-2) and the weight average molecular weight Mw of the polymer measured with GPC in terms of polystyrene was 1,800.

solutions of the resist underlayer film forming compositions. The addition ratio of the polymer in Table 1 is not the addition amount of the polymer solution but the addition amount of the polymer itself.

In Table 1, maleic acid is abbreviated as MA, benzyltriethylammonium chloride as BTEAC, N-(3-triethoxysilyl-propyl)-4,5-dihydroimidazole as IMIDTEOS, triphenylsulfonium nitrate as TPSNO3, mono-triphenylsulfonium maleate as TPSMA, triphenylsulfonium trifluoroacetate as TPSTFA, triphenylsulfonium chloride as TPSCl, triphenylsulfonium camphorsulfonate as TPSCS, triphenylsulfonium trifluoromethanesulfonate as TPSTf, triphenylsulfonium adamantanecarboxy-1,1,2-trifluorobutanesulfonate as TPSAdTF, dihydroxyphenylphenylsulfonium p-toluenesulfonate as DHPPSpTS, bisphenylsulfone as BPS, propylene glycol monomethyl ether acetate as PGMEA, propylene glycol monoethyl ether as PGEE, and propylene glycol monomethyl ether as PGME. As the water, ultrapure water was used. Each amount to be added was listed in part by mass.

TABLE 1

| | Si Polymer | Acid | Curing catalyst | Additive | Solvent | | | |
|---|---|---|---|---|---|---|---|---|
| Example 1 (part by mass) | Synthesis Example 1 2 | MA 0.02 | TPSNO3 0.06 | TPSCS 0.1 | PGME 15 | PGEE 65 | PGMEA 5 | Water 15 |
| Example 2 (part by mass) | Synthesis Example 2 2 | MA 0.02 | TPSMA 0.06 | TPSTf 0.06 | PGME 15 | PGEE 65 | PGMEA 5 | Water 15 |
| Example 3 (part by mass) | Synthesis Example 3 2 | MA 0.02 | BTEAC 0.012 | TPSNf 0.06 | PGME 15 | PGEE 65 | PGMEA 5 | Water 15 |
| Example 4 (part by mass) | Synthesis Example 4 2 | MA 0.02 | IMIDTEOS 0.006 | | PGME 15 | PGEE 65 | PGMEA 5 | Water 15 |
| Example 5 (part by mass) | Synthesis Example 5 2 | MA 0.02 | IMIDTEOS 0.006 | DHTPPSpTS 0.06 | PGME 15 | PGEE 65 | PGMEA 5 | Water 15 |
| Example 6 (part by mass) | Synthesis Example 6 2 | MA 0.02 | TPSTFA 0.06 | TPSAdTF 0.1 | PGME 15 | PGEE 65 | PGMEA 5 | Water 15 |
| Example 7 (part by mass) | Synthesis Example 7 2 | MA 0.02 | TPSCl 0.006 | BPS 0.1 | PGME 15 | PGEE 65 | PGMEA 5 | Water 15 |
| Example 8 (part by mass) | Synthesis Example 8 2 | MA 0.02 | TPSNO3 0.006 | TPSAdTF 0.1 | PGME 15 | PGEE 65 | PGMEA 5 | Water 15 |
| Example 9 (part by mass) | Synthesis Example 9 2 | MA 0.02 | TPSNO3 0.06 | TPSAdTF 0.1 | PGME 15 | PGEE 65 | PGMEA 5 | Water 15 |
| Comparative Example 1 (part by mass) | Comparative Synthesis Example 1 2 | MA 0.02 | TPSMA 0.006 | TPSTf 0.1 | PGME 15 | PGEE 65 | PGMEA 5 | Water 15 |
| Comparative Example 2 (part by mass) | Comparative Synthesis Example 2 2 | MA 0.02 | TPSNO3 0.06 | | PGME 15 | PGEE 65 | PGMEA 5 | Water 15 |

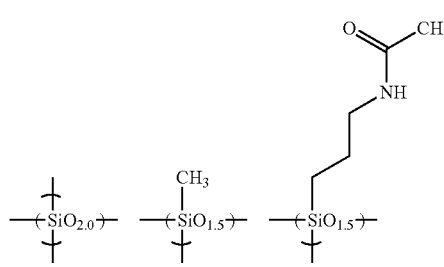

Formula (3-2)

(Preparation of Si—Containing Resist Underlayer Film)

The silicon-containing polymers obtained in Synthesis Examples 1 to 9 and Comparative Synthesis Example 1 and Comparative Synthesis Example 2, an acid, a curing catalyst, an additive, solvents, and water were mixed in the ratios listed in Table 1, and the mixture was filtered with a fluorocarbon resin filter of 0.1 μm to prepare each of the (Preparation of Organic Underlayer Film-Forming Composition)

Into a 100 mL four-necked flask, carbonazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), p-toluenesulfonic acid monohydrate (0.76 g, 0.0040 mol, manufactured by Tokyo Chemical Industry Co., Ltd.) were placed and then 1,4-dioxane (6.69 g, manufactured by KANTO CHEMICAL CO., INC.) was charged under nitrogen. The mixture was stirred and heated to 100° C. to dissolve the mixture and polymerization was started. After 24 hours, the solution was left to cool to 60° C., diluted with chloroform (34 g, manufactured by KANTO CHEMICAL CO., INC.), and reprecipitated in methanol (168 g, manufactured by KANTO CHEMICAL CO., INC.). The obtained precipitate was filtered and dried at 80° C. for 24 hours in a reduced pressure drier to give 9.37 g of a target polymer (Formula (4-1), hereinafter abbreviated as PCzFL).

Formula (4-1)

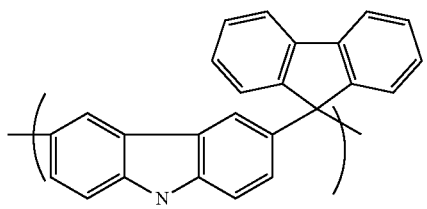

The measurement result of $^1$H-NMR of PCzFL was as follows.

$^1$H-NMR (400 MHz, DMSO-$d_6$): δ 7.03-7.55 (br, 12H), δ 7.61-8.10 (br, 4H), δ 11.18 (br, 1H)

The weight average molecular weight Mw and the degree of distribution Mw/Mn of PCzFL measured by GPC in terms of polystyrene were 2,800 and 1.77, respectively.

To 20 g of the obtained resin, 3.0 g of tetramethoxymethylglycoluril (trade name POWDERLINK 1174, manufactured by Mitsui Cytec, Ltd.) as a crosslinking agent, 0.30 g of pyridinium paratoluenesulfonate as a catalyst, and 0.06 g of Megafac R-30N (trade name, manufactured by DIC Corporation) were mixed and the mixture was dissolved in 88 g of propylene glycol monomethyl ether acetate to prepare a solution. Thereafter, the mixture was filtered using a polyethylene microfilter having a pore diameter of 0.10 μm and further filtered using a polyethylene microfilter having a pore size of 0.05 μm to prepare a solution of the organic underlayer film forming composition used for a lithography process using a multilayer film.

(Optical Constant Measurement)

Each of the Si-containing resist underlayer film forming compositions prepared in Examples 1 to 9 and Comparative Examples 1 and 2 was applied onto a silicon wafer using a spinner. The applied composition was heated on a hot plate at 200° C. for 1 minute to form a Si-containing resist underlayer film (film thickness: 0.05 μm). The refractive indices (n values) and optical absorption coefficients (also referred to as k values or attenuation coefficients) of these resist underlayer films at a wavelength of 193 nm were measured using a spectroscopic ellipsometer (VUV-VA-SEVU-302, manufactured by J. A. Woollam Co., Inc.).

(Measurement of Dry Etching Rate)

The etchers and etching gases used for the measurement of the dry etching rate were as follows.

ES 401 (manufactured by Nippon Scientific Co., Ltd.): $CF_4$

RIE-10NR (manufactured by Samco Inc.): $O_2$

Each of the solutions of the Si-containing resist underlayer film forming compositions prepared in Examples 1 to 9 and Comparative Examples 1 and 2 was applied onto a silicon wafer using a spinner. Each of the Si-containing resist underlayer films (film thickness 0.08 μm (for measurement of the etching rate with $CF_4$ gas)) and (film thickness 0.05 μm (for measurement of the etching rate with $O_2$ gas)) was formed by heating the applied solution on a hot plate at 240° C. for 1 minute. Similarly, the coating film of the organic underlayer film forming composition (composition containing the polymer of Formula (4-1)) (film thickness: 0.20 μm) was also formed on a silicon wafer using a spinner.

The dry etching rates of the Si-containing resist underlayer films of Examples 1 to 9 and Comparative Examples 1 and 2 were measured using $CF_4$ gas as an etching gas and compared with each other. The unit of the test result of the fluorine-based gas etching rate is angstrom/min.

The dry etching rates of the Si-containing resist underlayer films of Examples 1 to 9 and Comparative Examples 1 and 2 were measured using $O_2$ gas as an etching gas and compared with each other. The unit of the test result of the oxygen-based gas resistance is angstrom/min.

(Evaluation of Resist Patterning: Evaluation Through NTD Process Performing Development with Organic Solvent)

The organic underlayer film (A layer) forming composition obtained as the above formula was applied onto a silicon wafer and baked on a hot plate at 240° C. for 60 seconds to give an organic underlayer film (layer A) having a thickness of 200 nm. Onto the organic underlayer film, each of the Si-containing resist underlayer film (layer B) forming compositions obtained in Examples 1 to 9 and Comparative Examples 1 and 2 was applied and baked on a hot plate at 240° C. for 60 seconds to give a Si-containing resist underlayer film (layer B). The film thickness of the Si-containing resist underlayer film (layer B) was 30 nm.

Onto each of the B layers, a commercially available photoresist solution (manufactured by Fujifilm Corporation, trade name FAiRS-9521NT05) was applied by a spinner and heated on a hot plate at 100° C. for 1 minute to form a photoresist film (C layer) having a thickness of 85 nm.

The obtained photoresist film was exposed using an NSR-S307E scanner (wavelength 193 nm, NA, a: 0.85, 0.93/0.85, manufactured by Nikon Corporation) through a mask that is set so that a line width and a width between the lines of the photoresist of 0.060 μm, that is, dense lines having a line and space (L/S)=1/2 of 0.060 μm were formed after the development and a mask that is set so that a line width and a width between the lines of the photoresist of 0.058 μm, that is, dense lines having a line and space (L/S)=1/1 of 0.058 μm were formed after the development. Thereafter, the exposed resist was baked on a hot plate at 100° C. for 60 seconds, cooled, and thereafter developed for 60 seconds using butyl acetate (a solvent developer) to form a negative pattern on the resist underlayer film (layer B). With regard to the obtained photoresist pattern, a pattern that did not cause large pattern peeling, undercut, and thickening at the bottom of the line (footing) was evaluated as good.

In Table 2, the results of the refractive index and optical absorption coefficient at 193 nm, the fluorine gas etching rate, the oxygen-based gas resistance, and the skirt shape of the resist after lithography evaluation are listed.

TABLE 2

|  | Refractive index | Optical absorption coefficient | Fluorine-based gas etching rate | Oxygen-based gas resistance | Resist skirt shape |
|---|---|---|---|---|---|
| Example 1 | 1.65 | 0.14 | 24 | 0.02 | Good |
| Example 2 | 1.60 | 0.25 | 25 | 0.03 | Good |
| Example 3 | 1.70 | 0.35 | 26 | 0.04 | Good |
| Example 4 | 1.68 | 0.33 | 27 | 0.04 | Good |
| Example 5 | 1.68 | 0.33 | 27 | 0.04 | Good |
| Example 6 | 1.64 | 0.14 | 30 | 0.03 | Good |
| Example 7 | 1.64 | 0.18 | 24 | 0.02 | Good |
| Example 8 | 1.56 | 0.08 | 23 | 0.02 | Good |
| Example 9 | 1.56 | 0.08 | 28 | 0.04 | Good |
| Comparative Example 1 | 1.55 | 0.01 | 22 | 0.03 | Undercut |
| Comparative Example 2 | 1.57 | 0.07 | 23 | 0.03 | Footing |

[Formation of Resist Pattern by EUV Exposure]

The organic underlayer film (A layer) forming composition was applied onto a silicon wafer and baked on a hot plate at 215° C. for 60 seconds to give an organic underlayer film (layer A) having a thickness of 90 nm. On the A layer, the resist underlayer film forming composition solutions prepared in Examples 1, 6, 7, 8 and 9 of the present invention and Comparative Examples 1 and 2 were spin-coated and heated at 215° C. for 1 minute to form a resist underlayer film (layer B) (20 nm). On the hard mask, an EUV resist solution (methacrylate resin type resist) was spin-coated and heated to form an EUV resist layer (C layer). The EUV resist layer was exposed using an EUV exposure apparatus (Micro Exposure Tool, abbreviated as MET) under conditions of NA=0.30, σ=0.36/0.93, and Quadropole. After the exposure, PEB (post exposure bake) was carried out and the exposed sample was cooled to room temperature on a cooling plate, followed by developing and rinsing the sample to form a resist pattern. For the obtained resist pattern, a possibility of formation of 26 nm line and space and the pattern shape by observing the pattern cross section were evaluated.

In Table 3, "Good" means a state in which a shape between the footing and the undercut is rectangular and no significant residue in the space portion remains, "Collapsed" means an undesirable state in which the resist pattern is peeled and collapsed, and "Bridged" means an undesirable state in which the upper part or the lower part of the resist pattern is in contact with each other.

TABLE 3

|  | Pattern shape |
| --- | --- |
| Example 1 | Good |
| Example 6 | Good |
| Example 7 | Good |
| Example 8 | Good |
| Example 9 | Good |
| Comparative Example 1 | Collapsed |
| Comparative Example 2 | Bridged |

INDUSTRIAL APPLICABILITY

The resist underlayer film forming composition for lithography of the present invention can be used for a resist underlayer film forming composition for an ArF photoresist and a KrF photoresist, a resist underlayer film forming composition for an EUV resist or the like, a resist upper layer forming composition for an EUV resist, a resist underlayer film forming composition for an electron beam resist or the like, a resist upper layer forming composition for an electron beam resist, a reverse material forming composition, and the like.

The invention claimed is:

1. A resist underlayer film forming composition for lithography comprising: a hydrolyzable silane, a hydrolysis product thereof, a hydrolysis condensate thereof, or a combination thereof as a silane, wherein the hydrolyzable silane comprises a hydrolyzable silane having a trifluoroacetamide group.

2. The resist underlayer film forming composition according to claim 1, wherein the hydrolyzable silane having a trifluoroacetamide group is a hydrolyzable silane of Formula (1):

$$R^1_a R^2_b Si(R^3)_{4-(a+b)} \qquad \text{Formula (1)}$$

in Formula (1),

R$^1$ is an organic group of Formula (2):

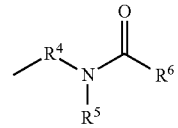

Formula (2)

in Formula (2),

R$^4$ is an organic group optionally having an amide group, an amino group, an ether group, or a sulfonyl group and the organic group is a C$_{1-10}$ alkylene group, an arylene group, or a combination thereof, R$^5$ is a hydrogen atom, and R$^6$ is a trifluoromethyl group, and is bonded to a silicon atom through a Si—C bond;

R$^2$ is an organic group having an alkyl group, an aryl group, a halogenated alkyl group, a halogenated aryl group, an alkoxyaryl group, an alkenyl group, or an epoxy group, an acryloyl group, a methacryloyl group, a mercapto group, an amino group, or a cyano group and is bonded to a silicon atom through a Si—C bond;

R$^3$ is an alkoxy group, an acyloxy group, or a halogen group; and a is an integer of 1, b is an integer of 0 to 2, and a+b is an integer of 1 to 3.

3. The resist underlayer film forming composition according to claim 1, wherein the hydrolyzable silane is a combination of the hydrolyzable silane of Formula (1) and other hydrolyzable silane, and the other hydrolyzable silane is at least one hydrolyzable silane selected from the group consisting of a hydrolyzable silane of Formula (3):

$$R^7_c Si(R^8)_{4-c} \qquad \text{Formula (3)}$$

in Formula (3), R$^7$ is an organic group having an alkyl group, an aryl group, a halogenated alkyl group, a halogenated aryl group, an alkoxyaryl group, an alkenyl group, or an epoxy group, an acryloyl group, a methacryloyl group, a mercapto group, or a cyano group and is bonded to a silicon atom through a Si—C bond; R$^8$ is an alkoxy group, an acyloxy group, or a halogen group; and c is an integer of 0 to 3, and a hydrolyzable silane of Formula (4):

$$[R^9_d Si(R^{10})_{3-d}]_2 Y_e \qquad \text{Formula (4)}$$

in Formula (4), R$^9$ is an alkyl group and is bonded to a silicon atom through a Si—C bond; R$^{10}$ is an alkoxy group, an acyloxy group, or a halogen group; Y is an alkylene group or an arylene group; d is an integer of 0 or 1; and e is an integer of 0 or 1.

4. The resist underlayer film forming composition according to claim 1, wherein the resist underlayer film forming composition comprises a hydrolysis condensate of a hydrolyzable silane made of a combination of the hydrolyzable silane of Formula (1)

  Formula (1)

in Formula (1), $R^1$ is an organic group of Formula (2), and the hydrolyzable silane of Formula (3)

  Formula (3)

in Formula (3), $R^7$ is an organic group having an alkyl group, an aryl group, a halogenated alkyl group, a halogenated aryl group, an alkoxyaryl group, an alkenyl group, or an epoxy group, an acryloyl group, a methacryloyl group, a mercapto group, or a cyano group and is bonded to a silicon atom through a Si—C bond; $R^8$ is an alkoxy group, an acyloxy group, or a halogen group; and c is an integer of 0 to 3, as a polymer.

5. The resist underlayer film forming composition according to claim 1, further comprising an acid.

6. The resist underlayer film forming composition according to claim 1, further comprising water.

7. The resist underlayer film forming composition according to claim 1, further comprising an organic polymer compound having a weight average molecular weight of 10,000 to 100,000.

8. The resist underlayer film forming composition according to claim 7, wherein the organic polymer compound is one or more polymers selected from the group consisting of polyesters, polystyrenes, polyimides, acrylic polymers, methacrylic polymers, polyvinyl ethers, phenol novolacs, naphthol novolacs, polyether, polyamides, and polycarbonates.

9. The resist underlayer film forming composition according to claim 7, wherein the organic polymer compound comprises an aromatic ring structure selected from the group consisting of a benzene ring, a naphthalene ring, an anthracene ring, a triazine ring, a quinoline ring, and a quinoxaline ring.

10. The resist underlayer film forming composition according to claim 7, wherein the organic polymer compound comprises hydroxy groups.

11. A resist underlayer film formed on a semiconductor substrate and made of a cured product of the resist underlayer film forming composition as claimed in claim 1.

12. A method for manufacturing a semiconductor device, the method comprising:
    applying the resist underlayer film forming composition as claimed in claim 1 onto a semiconductor substrate and baking the applied composition to form a resist underlayer film;
    applying a resist composition onto the resist underlayer film to form a resist film;
    exposing the resist film to light;
    developing the resist film after exposure to obtain a resist pattern;
    etching the resist underlayer film using the resist pattern; and
    processing the semiconductor substrate using the patterned resist film and resist underlayer film.

13. A method for manufacturing a semiconductor device, the method comprising:
    forming an organic underlayer film on a semiconductor substrate;
    applying a resist underlayer film forming composition according to claim 1 onto the organic underlayer film and baking the applied composition to form a resist underlayer film;
    applying a resist composition onto the resist underlayer film to form a resist film;
    exposing the resist film to light;
    developing the resist film after exposure to obtain a resist pattern;
    etching the resist underlayer film using the resist pattern;
    etching the organic underlayer film using the patterned resist underlayer film; and
    processing the semiconductor substrate using the patterned organic underlayer film.

* * * * *